(12) United States Patent
Nakamura

(10) Patent No.: US 6,291,763 B1
(45) Date of Patent: Sep. 18, 2001

(54) PHOTOELECTRIC CONVERSION DEVICE AND PHOTO CELL

(75) Inventor: Shigeru Nakamura, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/543,339

(22) Filed: Apr. 5, 2000

(30) Foreign Application Priority Data

Apr. 6, 1999 (JP) .................................................. 11-098707
Sep. 30, 1999 (JP) .................................................. 11-280203

(51) Int. Cl.⁷ ............................ H01L 31/04; H01M 14/00
(52) U.S. Cl. .......................... 136/256; 136/263; 136/252; 429/111; 250/200; 257/431
(58) Field of Search ..................................... 136/256, 263, 136/252; 429/111; 250/200; 257/431

(56) References Cited

U.S. PATENT DOCUMENTS

| 5,441,827 | * | 8/1995 | Gratzel et al. | 429/111 |
| 5,885,368 | * | 3/1999 | Lupo et al. | 136/263 |
| 6,043,428 | * | 3/2000 | Han et al. | 136/263 |
| 6,084,176 | * | 7/2000 | Shiratsuchi et al. | 136/263 |
| 6,150,605 | * | 11/2000 | Han | 136/263 |

OTHER PUBLICATIONS

Kay et al, "Low cost photovoltaic modules base on dye sensitized nanocrystalline titanium dioxide and carbon powder," Solar Energy Materials and Solar Cells, 44, pp. 99–117, 1996.*

Papageorgiou et al, "An Iodine/Triiodide Reduction Electrocatalyst for Aqueous and Organic Media," J. Electrochem. Soc., 144(3), pp. 876–884, Mar. 1997.*

Papageorgiou et al, "Mediator Transport in Multilayer Nanocrystalline Photoelectrochemical Cell Configurations," Journal of the Electrochemical Society, 146(3), pp. 898–907, Mar. 1999.*

Papageorgiou, N. et al, "Mediator Transport in Multilayer Nanocrystalline Photoelectrochemical Cell Configurations", Journal of The Electrochemical Society, 146 (3), pp. 898–907, Mar. 1999.

* cited by examiner

Primary Examiner—Alan Diamond
(74) Attorney, Agent, or Firm—Sughrue, Mion, Zinn Macpeak & Seas, PLLC

(57) ABSTRACT

A photoelectric conversion device comprising an electrically conductive substrate, a photosensitive semiconductor layer, a charge transporting layer, and a counter electrode (preferably a counter electrode having a porous electron-conducting layer), wherein an electrically insulating spacing layer is provided between the semiconductor layer and the counter electrode, and a photo cell having the device. High conversion efficiency is obtained without causing an internal shortage.

15 Claims, 3 Drawing Sheets

PHOTOELECTRIC CONVERSION DEVICE AND PHOTO CELL

FIELD OF THE INVENTION

This invention relates to a photoelectric conversion device using a semiconductor, more particularly, a photoelectric conversion device using dye-sensitized semiconductor and a photo cell comprising the device.

BACKGROUND OF THE INVENTION

Study of practical solar photogeneration has been directed chiefly to improvement of monocrystalline silicon solar cells, polycrystalline silicon solar cells, amorphous silicon solar cells, and compound solar cells using cadmium telluride, copper indium selenide, etc. The solar energy conversion efficiency achieved to date has exceeded 10%. It is required for the spread of solar cells in the future to overcome such difficulties as a high energy cost incurred for the material production, which involves a considerable environmental load, and a long energy payback time, which is not user friendly. Although many solar cells using photoconductive organic materials as a substitute for silicon have been proposed aiming at an increase of working area and a reduction of cost, they have a low conversion efficiency and poor durability.

Under these circumstances, Nature, vol. 353, pp. 737–740 (1991) and U.S. Pat. No. 4,927,721 disclosed a photoelectric conversion device using dye-sensitized semiconductor (fine) particles, a solar cell comprising the device, and materials and techniques for producing them. The proposed cell is a wet type solar cell comprising, as a work electrode, a porous thin film of titanium dioxide spectrally sensitized by a ruthenium complex. A primary advantage of this system is that an inexpensive oxide semiconductor, such as titanium dioxide, can be used without being highly purified so that a photoelectric conversion device can be supplied at a competitive price. A secondary advantage is that the sensitizing dye used shows a broad absorption spectrum so that a considerably broad range of visible light can be converted to electricity. Thirdly, a high energy conversion efficiency can be reached.

Before the above technique can be practically applied to a solar cell, it has been an important subject to improve durability of the charge transporting layer. Although an organic solvent solution of a redox compound was initially studied as a charge transporting layer, it turned out that the organic solvent evaporates to seriously deteriorate the performance. To solve this problem, use of a molten salt that is liquid at an ordinary temperature or a solid charge transporting material has been studied. However, because these charge transporting layers tend to show reduced charge mobility, how to reduce the thickness of the charge transporting layer has been a weighty subject.

Spacers are generally interposed between the substrate having the particulate semiconductor layer and the counter electrode in order to prevent a shortage due to a direct contact therebetween. However, since there are unavoidable variations in thickness of the semiconductor layer and thickness of the spacers, a shortage due to a direct contact of electrodes is often experienced in case where the thickness of the charge transporting layer is reduced by reducing the distance between the electrodes.

Further, where a cell having a wide working area is designed while using the spacers, both the substrate for the work electrode and that for the counter electrode must be of a rigid material with high flatness. Besides, the designing will meet difficulty in securing a given thickness of the charge transporting layer over the entire area and also in maintaining the thickness over a long period of time, failing to retain the cell performance as contemplated.

Furthermore, it has been difficult to make thin spacers. In the practice of the art, it is still difficult to make a spacer having a thickness of several tens of microns.

SUMMARY OF THE INVENTION

An object of the present invention is to provide a photoelectric conversion device and a photo cell comprising the device, especially a solar cell, which are prevented from causing an internal shortage and exhibit excellent energy conversion efficiency.

The above object is accomplished by a photoelectric conversion device comprising at least a photosensitive semiconductor layer, a charge transporting layer, and a counter electrode, wherein an electrically insulating spacing layer is provided between the semiconductor layer and the counter electrode.

In a highly preferred embodiment of the invention, the counter electrode has a porous electron-conducting layer.

The invention provides a photoelectric device and a photo cell which are prevented from causing an internal shortage and exhibit excellent conversion efficiency.

DETAILED DESCRIPTION OF THE INVENTION

Figure 1:
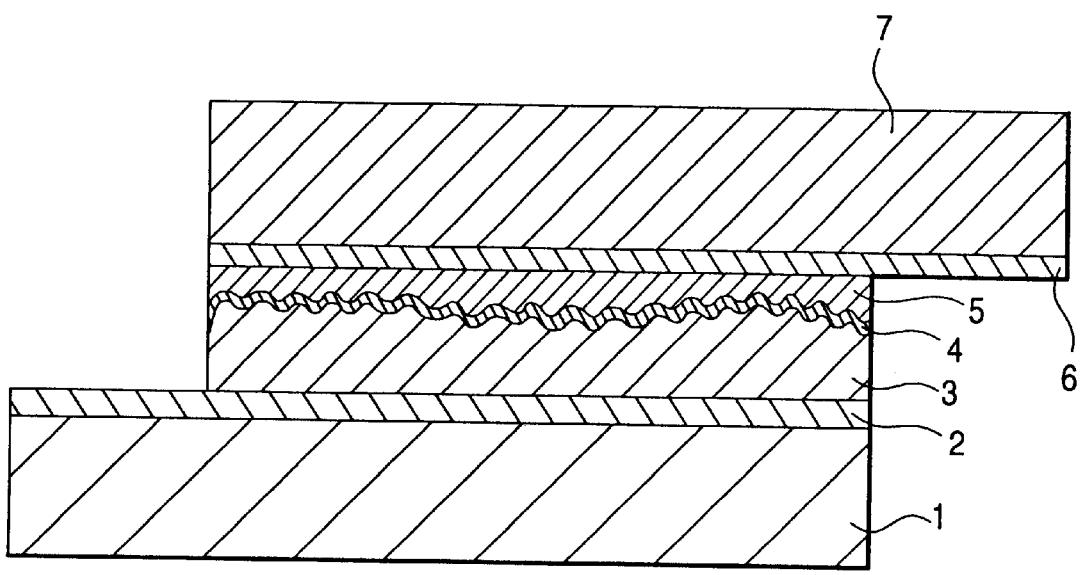
FIG. 1 is a schematic cross section of the photo cell prepared in Examples.

The embodiments and preferred embodiments of the present invention are listed below.

1. A photoelectric conversion device comprising at least a photosensitive semiconductor layer, a charge transporting layer, and a counter electrode, wherein an electrically insulating spacing layer is provided between said semiconductor layer and said counter electrode.
2. The photoelectric conversion device according to item 1, wherein said spacing layer comprises a material having an electrical conductivity of $10^{-6}$ Siemens/cm or less.
3. The photoelectric conversion device according to item 1, wherein said spacing layer is provided in contact with said photosensitive semiconductor layer.
4. The photoelectric conversion device according to item 1, wherein said spacing layer is a porous layer comprising electrically insulating particles bound together.
5. The photoelectric conversion device according to item 4, wherein said electrically insulating particles comprise an oxide of at least one element selected from aluminum, silicon, boron, and phosphorus.
6. The photoelectric conversion device according to item 4, wherein said electrically insulating particles comprise an organic polymer.
7. The photoelectric conversion device according to item 1, wherein said counter electrode has a porous electron-conducting layer.
8. The photoelectric conversion device according to item 7, wherein said porous electron-conducting layer is in contact with said spacing layer.

9. The photoelectric conversion device according to item 7, wherein said porous electron-conducting layer comprises electrically conductive particles bound together.

10. The photoelectric conversion device according to item 9, wherein said electrically conductive particles are platinum black particles or carbon particles having platinum supported thereon.

11. The photoelectric conversion device according to item 7, wherein said counter electrode comprises an electrically conductive substrate having provided thereon said porous electron-conducting layer.

12. The photoelectric conversion device according to item 1, wherein said photosensitive semiconductor layer comprises titanium dioxide.

13. The photoelectric conversion device according to item 1, wherein said photosensitive semiconductor layer is sensitized with a dye.

14. The photoelectric conversion device according to item 1, wherein said charge transporting layer contains a molten salt.

15. A photo cell having a photoelectric device comprising at least a photosensitive semiconductor layer, a charge transporting layer, and a counter electrode, wherein an electrically insulating spacing layer is provided between said semiconductor layer and said counter electrode.

16. The photo cell according to item 15, wherein said counter electrode has a porous electron-conducting layer.

The photoelectric conversion device according to this invention comprises an electrically conductive substrate, a photo electrode comprising a semiconductor layer (photosensitive layer) provided on the conductive substrate, a counter electrode, and a charge transporting layer which electrically connects the photo electrode and the counter electrode. If desired, the semiconductor layer can be sensitized with a dye to form a dye-sensitized semiconductor layer. The conductive substrate having the semiconductor layer is a work electrode functioning as a (photo) anode in the photoelectric conversion device. The photoelectric device of the invention works as a photo cell in which the work electrode (i.e., the photo electrode) exhibits electromotive force under photo-irradiation to supply an electric current to an external circuit. Where the charge transporting layer is of an ion-conducting electrolyte, the photo cell is a photo-electrochemical cell.

The photosensitive semiconductor layer is designed to fit for the end use and can have either a single layer structure or a multilayer structure. In the case of the dye-sensitized semiconductor layer, light having entered into the photosensitive layer is absorbed by the dye to excite the dye. The excited dye emits high energy electrons, which are injected to the conduction band of the semiconductor particles and diffused in the semiconductor bulk to reach the counter electrode. The dye molecules having handed over the electrons are converted into an electron-deficient oxidized state and regenerated by electronic reduction with an electron donor in the charge transporting material in contact with the dye. That is, the excited electrons received by the conductive substrate work electrically in the external circuit, are transmitted to the counter electrode, and return to the oxidized dye through the charge transporting layer thereby to regenerate the dye. While the device and the cell of the invention have a layered structure, the materials, compounds or ions constituting the individual layers may be diffused and mixed mutually at their boundaries, for example, the boundary between the conductor layer (hereinafter described) of the conductive substrate and the photosensitive layer, the boundary between the photosensitive layer and the charge transporting layer, and the boundary between the charge transporting layer and the counter electrode.

The characteristic of the present invention lies in that a spacing layer which is substantially electrically insulating is provided between the semiconductor layer and the counter electrode, by which the charge transporting layer electrically connecting the semiconductor layer and the counter electrode can be reduced in thickness without involving a fear of an internal shortage. In a highly preferred embodiment, the counter electrode has a porous electron-conducting layer. It is necessary in the invention that the charge transporting material penetrates the spacing layer and the electron-conducting layer, if provided. It is desirable for the charge transporting material to penetrate the semiconductor layer, too. That is, the charge transporting layer does not need to be an independent layer with definite boundaries.

The semiconductor used in the work electrode (i.e., the photo electrode) is a material capable of developing electrical conductivity when excited, e.g., on light energy absorption. It has a valence electron band and a conduction band as energy levels and, on being excited with light whose wavelength corresponds to the forbidden gap, generates electrons in the conduction band and positive holes in the valence electron band. The electrons take the main role of conduction as a carrier in n-type semiconductors, while the positive holes serve as a main carrier in p-type semiconductors. The semiconductor which can be used as a dye-sensitized semiconductor is preferably of n-type in which the electrons generated by photo excitement become carriers to afford an anode current. When an excited n-type semiconductor generates electrons in a (positively) anodically polarized state, an anodically rectified current is generated. n-Type semiconductors having a carrier concentration of $10^{14}$ to $10^{20}/cm^3$ are preferred. In the dye-sensitized semiconductor, the tasks of light absorption and generation of excited electrons and positive holes are chiefly performed by the dye molecules, and the semiconductor plays a role in accepting the excited electrons in the conduction band and transmitting the electrons to the electrode. Such a mechanism of the dye-sensitized semiconductor electrode concerning the present invention is described in detail in K. Honda and A. Fujishima, *Kagaku Sosetsu*, No. 7, p. 77 (1976) and T. Watanabe, T. Takizawa and K. Honda, *Shokubai*, No. 20, p. 370 (1978).

The semiconductor which can be used in the invention includes single body semiconductors, e.g., Si or Ge, III–V series compound semiconductors, metal chalcogenides (e.g., oxides, sulfides, and selenides), and perovskite semiconductors (e.g., strontium titanate, calcium titanate, sodium titanate, barium titanate, and potassium niobate). Examples of the metal chalcogenides preferably include an oxide of titanium, tin, zinc, iron, tungsten, zirconium, hafnium, strontium, indium, cerium, yttrium, lanthanum, vanadium, niobium or tantalum; a sulfide of cadmium, zinc, lead, silver, antimony or bismuth; a selenide of cadmium or lead; and cadmium telluride. Other compound semiconductors include a phosphide of zinc, gallium, indium or cadmium, gallium arsenide, copper-indium selenide, and copper-indium sulfide.

Preferred semiconductors for use in the invention include Si, $TiO_2$, $SnO_2$, $Fe_2O_3$, $WO_3$, ZnO, $Nb_2O_5$, CdS, ZnS, PbS, $Bi_2S_3$, CdSe, CdTe, GaP, InP, GaAs, $CuInS_2$, and $CuInSe_2$. Still preferred are $TiO_2$, ZnO, $SnO_2$, $Fe_2O_3$, $WO_3$, $Nb_2O_5$, CdS, PbS, CdSe, InP, GaAs, $CuInS_2$, and $CuInSe_2$. $TiO_2$ and $Nb_2O_5$ are particularly preferred, with $TiO_2$ being the most preferred.

The semiconductor may be a single crystal or polycrystalline. A single crystal is preferred for conversion efficiency, while a polycrystalline semiconductor is preferred from the standpoint of production cost, supply of raw materials, and an energy payback time. A porous semiconductor layer of finely particulate semiconductors having a particle size on the order of nanometers to microns is particularly preferred. The particulate semiconductors preferably have an average primary particle size of 5 to 200 nm, particularly 8 to 100 nm, in terms of a diameter of circle corresponding to a projected area (i.e., an equivalent circle diameter). The semiconductor particles in a dispersed state (secondary particles) preferably have an average particle size of 0.01 to 100 μm, and particularly 0.02 to 20 μm.

Semiconductor particles of two or more kinds having different sizes can be used as a mixture. In this case, the average size of smaller particles is preferably 5 nm or less. For the purpose of scattering incident light to improve the rate of capturing light, large semiconductor particles of about 300 nm in size may be used in combination.

The particulate semiconductor is preferably prepared by sol-gel processes described, e.g., in Sumio Sakubana, Sol-gel-ho no kagaku, Agune Syofusha (1988), and Gijutsu Joho Kyokai, Sol-gel-ho niyoru hakumaku coating gijutsu (1995), and a gel-sol process described in Tadao Sugimoto, *Materia*, vol. 35, No. 9, pp. 1012–1018, "Shin goseiho gel-sol-ho niyoru tanbunsan ryushi no gosei to size keitai seigyo" (1996). The process for preparing an oxide developed by Degussa AG which comprises pyrogenically hydrolyzing a metal chloride in an oxyhydrogen flame is also preferred.

For preparation of titanium oxide particles, a sulfuric acid process and a chlorine process described in Manabu Seino, Sanka titan busseito ohyogijutu, Gihodo (1997) are also employable for preference in addition to the above-described sol-gel processes, gel-sol process and pyrogenic flame hydrolysis.

Of the sol-gel processes for preparing titanium oxide particles, particularly preferred are the process described in C. J. Barbe, et al., *J. Am. Ceram. Soc.,* vol. 80, No. 12, pp. 3157–3171 (1997) and the process described in Burnish, et al., *Chemistry of Materials,* vol. 10, No. 9, pp. 2419–2425.

Titanium oxide may take either an anatase form and a rutile form according to the production process or thermal history and is often obtained as a mixture of anatase and rutile. Titanium oxide comprising anatase in a major proportion, particularly 80% or more, is preferred in the invention; for the longer wavelength end of the absorption spectrum of anatase is shorter than that of rutile so that ultraviolet deterioration of the photoelectric conversion device may be suppressed. The anatase content is obtained from the intensity ratio of the diffraction peaks assigned to anatase and rutile in X-ray diffractometry.

The electrically conductive substrate supporting the semiconductor layer is preferably substantially transparent to light. The term "substantially transparent" means that the visible light (wavelength: 400 to 900 nm) transmission is at least 10%, preferably 50% or more, still preferably 70% or more. The conductive substrate which is substantially transparent includes glass or plastics having on the surface thereof a conductor layer. Preferred conductors include metals (e.g., platinum, gold, silver, copper, aluminum, rhodium, and indium), carbon, and electrically conductive metal oxides (e.g., indium tin oxide (ITO) and F-doped tin oxide). The thickness of the conductor layer is such that assures substantial transparency, preferably from about 0.02 to 10 μm.

The conductive substrate preferably has as low a surface resistivity as possible. A desirable surface resistivity is 100 $\Omega/\square$ (square) or smaller, particularly 40 $\Omega/\square$ or smaller. While not limiting, the practical minimal surface resistivity is about 0.1 $\Omega/\square$.

Of the above conductive substrates preferred are those comprising glass or plastic coated with a conductive metal oxide. Particular preferred is conductive glass obtained by depositing F-doped tin dioxide on inexpensive soda-lime float glass. For the manufacture of competitive flexible photoelectric conversion devices or photo cells, a transparent polymer film having the above-described conductor layer is conveniently used. Useful transparent polymers include tetraacetylcellulose (TAC), polyethylene terephthalate (PET), polyethylene naphthalate (PEN), syndiotactic polystyrene (SPS), polyphenylene sulfide (PPS), polycarbonate (PC), polyarylate (PAr), polysulfone (PSF), polyester sulfone (PES), polyether-imide (PEI), cyclic polyolefins, and brominated phenoxy resins. The amount of the conductive metal oxide is preferably 0.01 to 100 g/m$^2$ based on the glass or plate substrate. The transparent conductive substrate is preferably used in such a manner that incident light enters from the side of the glass or plastic substrate.

In order to decrease the resistance of the transparent conductive substrate, a metal lead can be used. The metal lead is preferably made of aluminum, copper, silver, gold, platinum, nickel, etc., with an aluminum lead or a silver lead is particularly preferred. It is preferred that a metal lead be provided on the transparent substrate by vapor deposion, sputtering or a like deposition technique, on which a transparent conductor layer of F-doped tin oxide or ITO is provided. It is also preferred that the metal lead be formed on the transparent conductor layer provided on the transparent substrate. Reduction in incident light quantity due to the metal lead is usually 1 to 10%, preferably 1 to 5%.

The semiconductor particles are applied to the conductive substrate by, for example, a method comprising coating the conductive substrate with a dispersion or colloidal solution of the (particulate) semiconductor particles or the aforementioned sol-gel process, and the like. Film formation in a wet system is relatively advantageous, taking into consideration suitability to mass production of a photoelectric conversion device, liquid physical properties, and adaptability to various substrates. Film formation in a wet system is typically carried out by coating or printing.

A dispersion of the semiconductor particles is prepared by the above-mentioned sol-gel process, a method comprising grinding a semiconductor in a mortar, or a method comprising wet grinding a semiconductor in a mill. A synthetic semiconductor as precipitated in a solvent in the form of fine particles can also be used as such. Examples of useful dispersing media include water and various organic solvents, such as methanol, ethanol, isopropyl alcohol, dichloromethane, acetone, acetonitrile, and ethyl acetate. In preparing a dispersion, a polymer, a surface active agent, an acid, a chelating agent, and the like may be added as a dispersing aid if desired.

Examples of the wet coating techniques include application methods such as roll coating and dip coating, metering methods such as air knife coating or blade coating, and application methods combined with metering such as wire bar coating (JP-B-58-4589) [the term "JP-B" as used herein means an examined Japanese patent publication.], slide hopper coating (U.S. Pat. Nos. 2,681,294, 2,761,419, and 2,761,791), extrusion coating, and curtain coating. General-purpose spin coating or spraying techniques are also suitable. Examples of the wet printing techniques include letterpress printing, offset printing, gravure printing, intaglio printing, rubber plate printing, and screen printing. A suitable film formation system is chosen from among the above-enumerated techniques in accordance with the liquid viscosity and a desired wet thickness.

The liquid viscosity is largely dependent on the kind and the dispersibility of the semiconductor particles, the solvent, and additives such as a surface active agent and a binder. In order to form a uniform film, extrusion coating or casting is fit for a high viscous liquid (e.g., 0.01 to 500 Poise), while slide hopper coating, wire barcoating or spin coating is suited for a low viscous liquid (e.g., 0.1 Poise or lower). A low viscous liquid could be applied by extrusion coating where it is to be applied to some coating weight. Screen printing, as is often used in applying a high-viscosity paste of semiconductor particles, can be used as well. Thus, a suitable wet process for film formation can be selected in accordance with such parameters as the liquidviscosity, the coating weight, the type of the substrate, the speed of application, and so forth.

The semiconductor layer (i.e., the (particulate) semiconductor particle-containing layer) does not need to be a single layer. Two or more layers different in particle size of semiconductor particles, in kind of semiconductors or in composition as for the binder or additives can be provided. In case where single operation of application is insufficient for giving a desired thickness, multilayer coating is effective. Extrusion coating or slide hopper coating is fit for multilayer coating. Multilayer coating can be carried out simultaneously or by successively repeating coating operation several times or more than ten times. Screen printing is preferably applicable to successive multilayer coating.

In general, as the thickness of the particulate semiconductor layer increases, the amount of the dye held per unit projected area increases to show an increased rate of capturing light, but the distance of diffusion of generated electrons also increases, which results in an increased loss due to re-coupling of charges. Accordingly, there is a favorable thickness range for the particulate semiconductor layer, which is typically from 0.1 to 100 $\mu$m. Where the device is used as a photo cell, a more favorable thickness is 1 to 30 $\mu$m, particularly 2 to 25 $\mu$m. The coating weight of the semiconductor particles is preferably 0.5 to 400 g/m$^2$, still preferably 5 to 100 g/m$^2$ base on the substrate.

It is preferred that the semiconductor particles applied to the substrate be heated to bring them into electronic contact with each other, to improve film strength, and to improve adhesion to the substrate. A preferred heating temperature is 40° C. or higher and lower than 700° C., particularly from 100 to 600° C. The heating time is usually from 10 minutes to about 10 hours. Where a substrate having a low melting point or a softening point, such as apolymer film, is used, high-temperature treatment which would deteriorate the substrate should be avoided. For the economical consideration, too, the heating temperature is preferably as low as possible. The heating temperature can be lowered by using the above-mentioned small semiconductor particles having a diameter of up to 5 nm in combination or by conducting the heat treatment in the presence of a mineral acid.

For the purpose of increasing the surface area of the semiconductor particles and of increasing the purity in the vicinities of the semiconductor particles thereby to improve electron injection efficiency from the dye to the semiconductor particles, the heat-treated particulate semiconductor layer can be subjected to chemical plating with a titanium tetrachloride aqueous solution or electrochemical plating with a titanium trichloride aqueous solution.

It is preferable for the semiconductor particles to have a large surface area so that they may adsorb as large an amount of a dye as possible. The surface area of the semiconductor particles in the state applied to the conductive substrate is preferably 10 times or more, still preferably 100 times or more, the projected area. The practical upper limit of the surface area is, while not limited, about 1000 times the projected area.

Examples of the dyes which can be used in the invention preferably include metal complex dyes and polymethine dyes. In the invention, two or more kinds of dyes are used in combination so as to broaden the wavelength region of photoelectric conversion and to increase the conversion efficiency. The kinds and ratio of the dyes to be combined can be selected in conformity with the wavelength region and the intensity distribution of a light source to be used. It is preferred for the dyes to have an appropriate interlocking group for linking to the surface of the semiconductor particles. Examples of the preferred interlocking groups include —OH, —COOH, —SO$_3$H, a cyano group, —P(O) (OH)$_2$, —OP(O) (OH)$_2$, and chelating groups having pi conductivity, such as oxime, dioxime, hydroxyquinoline, salicylate and $\alpha$-keto-enolate groups. Particularly preferred of them are —COOH, —P(O) (OH)$_2$, and —OP(O) (OH)$_2$. The interlocking group may be in the form of a salt with an alkali metal, etc. or an intramolecular salt. Where the methine chain of a polymethine dye has an acidic group as in the case where the methine chain forms a squarylium ring or a croconium ring, that moiety can be used as a interlocking group.

The metal complex dyes of the present invention preferably include ruthenium complex dyes. Those represented by formula (I) are still preferred.

  (I)

wherein A$_1$ represents a ligand selected from the group consisting of Cl, SCN, H$_2$O, Br, I, CN, —NCO and SeCN; p represents an integer of 0 to 3, preferably 2; and B$_a$, B$_b$, and B$_c$ each represent an organic ligand selected from B-1 to B-8 shown below.

B-1

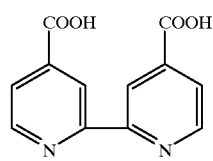

B-2

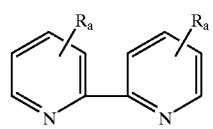

B-3

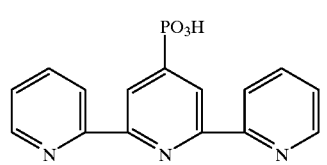

B-4

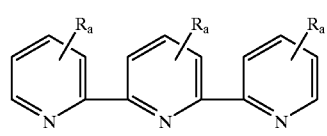

-continued

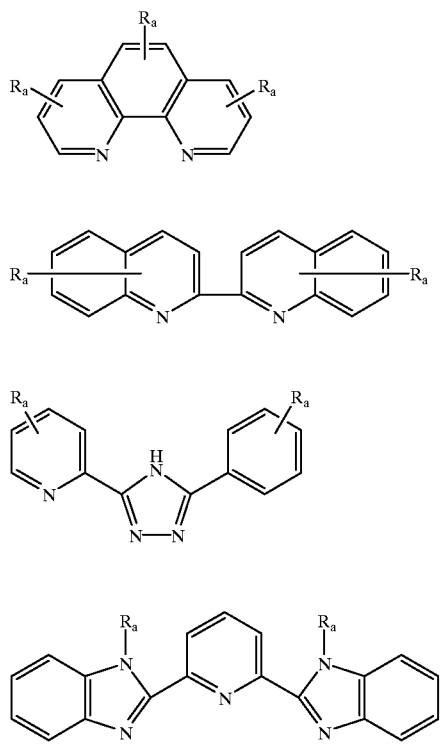

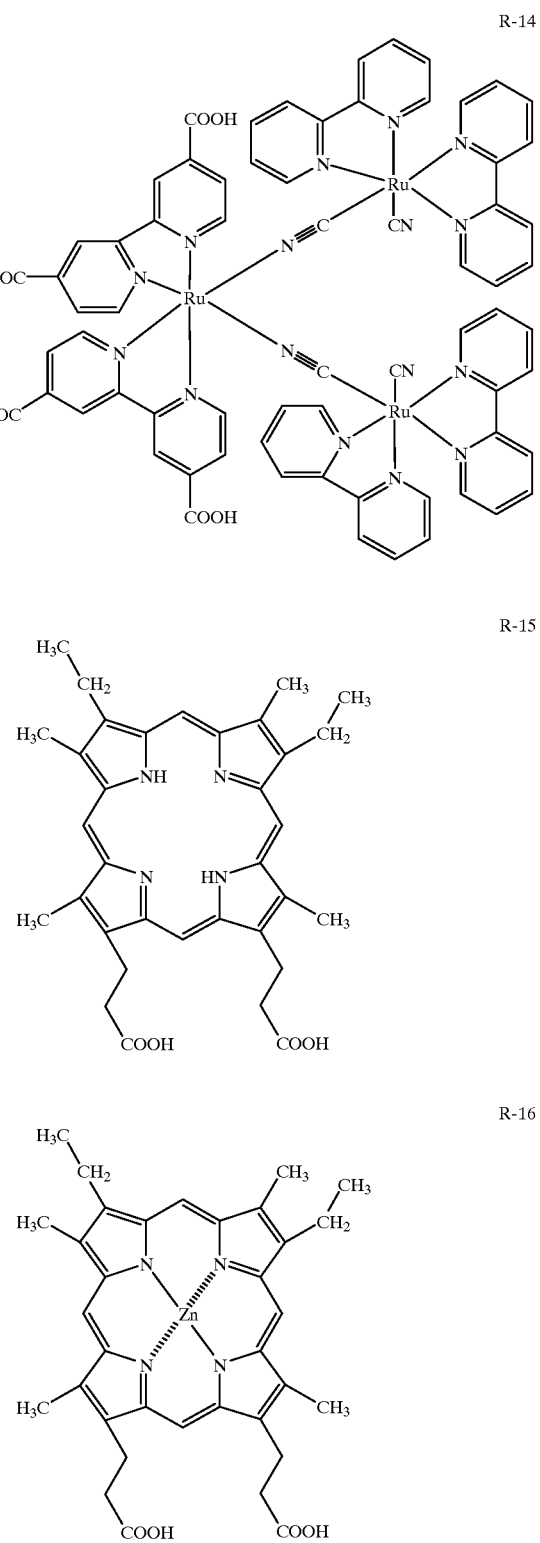

wherein $R_a$ represents a substituent, such as a halogen atom, a substituted or unsubstituted alkyl group having 1 to 12 carbon atoms, a substituted or unsubstituted aralkyl group having 7 to 12 carbon atoms, a substituted or unsubstituted aryl group having 6 to 12 carbon atoms, or an acidic group (e.g., a carboxyl group or a phosphoric acid group). The alkyl group and the alkyl moiety of the aralkyl group may be either straight chain or branched, and the aryl group and the aryl moiety of the aralkyl group may be either monocyclic or polycyclic (condensed rings).

Examples of useful ruthenium complex dyes are given in U.S. Pat. Nos. 4,927,721, 4,684,537, 5,084,365, 5,350,644, 5,463,057, and 5,525,440, JP-A-7-249790, JP-W-10-504521, and WO 98-50393. Specific examples of preferred ruthenium complex dyes represented by formula (I) are tabulated below.

| | $(A_1)_p RuB_a B_b B_c$ | | | | | |
|---|---|---|---|---|---|---|
| No. | $A_1$ | p | $B_a$ | $B_b$ | $B_c$ | $R_a$ |
| R-1 | SCN | 2 | B-1 | B-1 | — | — |
| R-2 | CN | 2 | B-1 | B-1 | — | — |
| R-3 | Cl | 2 | B-1 | B-1 | — | — |
| R-4 | Br | 2 | B-1 | B-1 | — | — |
| R-5 | I | 2 | B-1 | B-1 | — | — |
| R-6 | SCN | 2 | B-1 | B-2 | — | H |
| R-7 | SCN | 1 | B-1 | B-3 | — | — |
| R-8 | Cl | 1 | B-1 | B-4 | — | H |
| R-9 | I | 2 | B-1 | B-5 | — | H |
| R-10 | SCN | 2 | B-1 | B-6 | — | H |
| R-11 | CN | 2 | B-1 | B-7 | — | H |
| R-12 | Cl | 1 | B-1 | B-8 | — | H |
| R-13 | — | 0 | B-1 | B-1 | B-1 | — |

Specific examples of other suitable metal complex dyes are shown below.

R-17

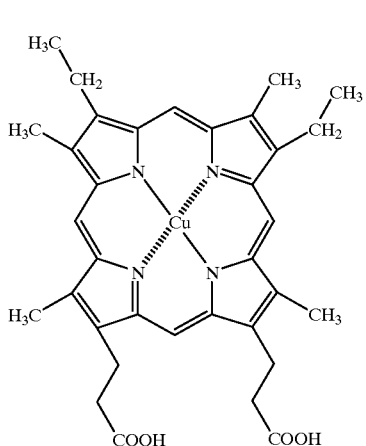

R-18

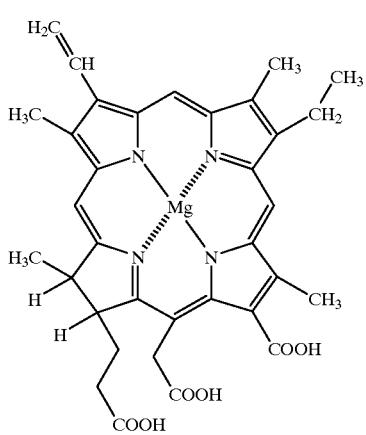

R-19

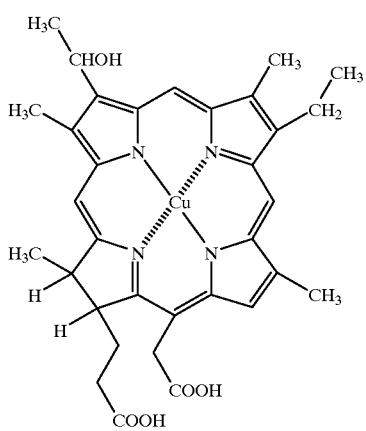

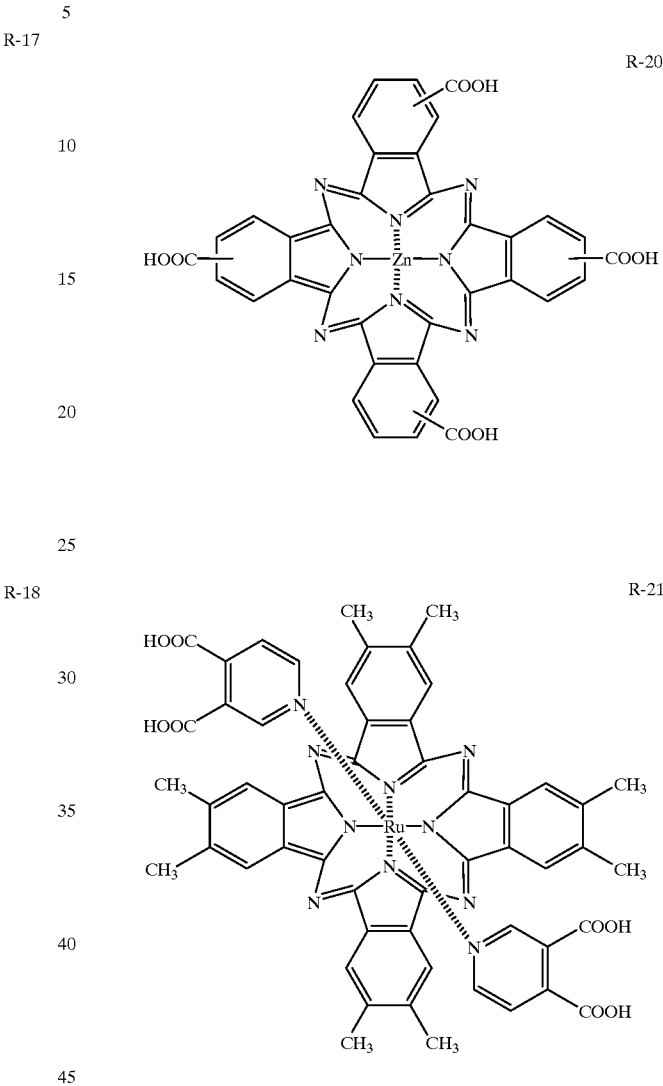

The polymethine dyes which can be used preferably include those described in JP-A-11-35836 (the term "JP-A" as used herein means an "unexamined published Japanese patent application."), JP-A-11-158395, JP-A-11-163378, JP-A-11-214730, JP-A-11-214731, EP 892411, and EP 911841.

Adsorption of the dye onto semiconductor particles is usually effected by dipping the well-dried work electrode (i.e., photo electrode) containing semiconductor particles in a dye solution or coating the semiconductor layer with a dye solution. The former method includes immersion, dip coating, roll coating or air knife coating. In case of immersion, the dye adsorption may be carried out at room temperature, or the dye solution may be heated under reflux as taught in JP-A-7-249790. The latter method includes wire bar coating, slide hopper coating, extrusion coating, curtain coating, spin coating, spraying, letterpress printing, offset printing, gravure printing, and screen printing.

The solvent of the dye solution is selected appropriately according to the solubility of the dye. Examples of the useful solvents include water, alcohols (e.g., methanol, ethanol, t-butanol, and benzyl alcohol), nitriles (e.g., acetonitrile, propionitrile and 3-methoxypropionitrile), nitromethane, halogenated hydrocarbons (e.g., dichloromethane, dichloroethane, chloroform, and chlorobenzene), ethers (e.g., diethyl ether and tetrahydrofuran), dimethyl sulfoxide, amides (e.g., N,N-dimethylformamide and N,N-dimethylacetamide), N- methylpyrrolidone, 1,3-dimethylimidazolidinone, 3-methyloxazolidinone, esters (e.g., ethyl acetate and butyl acetate), carbonic esters (e.g., diethyl carbonate, ethylene carbonate, and propylene carbonate), ketones (e.g., acetone, 2-butanone and cyclohexanonel, hydrocarbons (e.g., hexane, petroleum ether, benzene and toluene), and mixtures thereof.

As previously described with regard to the formation of the particulate semiconductor layer, extrusion coating and various printing methods are fit for a high viscous dye solution (e.g., 0.01 to 500 Poise), while slide hopper coating, wire bar coating and spin coating are suited for a low viscous dye solution (e.g., 0.1 Poise or lower) to form a uniform film. In this way, an appropriate technique for dye adsorption is to be selected according to such parameters as the viscosity of the dye solution, the coating weight, the kind of the substrate, the speed of application, and the like. Taking the suitability to mass production into consideration, the time required for dye adsorption after dye application is conveniently as short as possible.

In order to obtain a sufficient sensitizing effect, the dyes are preferably adsorbed in a total amount of 0.01 to 100 mmol perm$^2$ of the substrate and 0.01 to 1 mmol per gram of the particulate semiconductor particles. With too small a total amount of the dyes, the sensitizing effect would be insufficient. If the dyes are used in too large a total amount, the non-adsorbed dyes wilL float only to reduce the sensitizing effect.

Because unadsorbed dyes cause disturbances of device performance, the semiconductor layer is preferably washed immediately after dye adsorption to remove the excess dyes. Washing is conveniently carried out in a wet washing tank with an organic solvent, such as a polar solvent (e.g., acetonitrile) or an alcohol. The above-described heat treatment of the semiconductor layer before dye adsorption is also favorable for increasing the amount of the dyes adsorbed. In this case, it is preferred that the dyes be quickly adsorbed onto the heated semiconductor layer while it is between 40° C. and 80° C. so as to prevent water from being adsorbed to the semiconductor particles.

A colorless compound may be adsorbed together with the sensitizing dye so as to lessen the interaction among the dye molecules, such as association. Hydrophobic compounds such as carboxyl-containing steroid compounds (e.g., chenodeoxycholic acid) can be used. Further, for the purpose of accelerating removal of the excess dye, the surface of the semiconductor particles on which the dye has been adsorbed can be treated with an amine. Examples of the preferred amines include pyridine, 4-t-butylpyridine, and polyvinylpyridine. The amine can be used as such where it is liquid, or as dissolved in an organic solvent.

For the purpose of preventing ultraviolet deterioration, an ultraviolet absorbent may be adsorbed together with the sensitizing dye.

A spacing layer (i.e., a spacer layer) of a substantially electrically insulating material is provided between the semiconductor layer and the counter electrode to prevent a shortage. The term "substantially electrically insulating" as used herein means that the material has an electrical conductivity of preferably $10^{-3}$ Siemens/cm or less, preferably $10^{-6}$ Siemens/cm or less, more preferably $10^{-10}$ Siemens/cm or less and most preferably $10^{-12}$ Siemens/cm or less. Any electrically insulating substance that is inert to the components constituting the charge transporting layer can be selected arbitrarily. But the material such as titanium dioxide which is easily adsorbed with the dye used in the photosensitive layer is not preferred as the material of the spacing layer.

Such a substance includes oxide glass and crystalline oxides. An example of preferred oxide glass is glass containing at least one element selected from silicon, boron and phosphorus, and an example of preferred crystalline oxides is aluminum oxide.

Still preferred oxide glass includes glass containing at least one of silicon, boron and phosphorus and having a softening point of 700° C. or lower. Example of compositions of such oxide glass include $Na_{0.2}B_{0.4}P_{0.4}O_x$, $Rb_{0.2}B_{0.4}P_{0.4}O_x$, $Pb_{0.5}B_{0.25}Si_{0.25}O_x$, $Sn_{0.2}Pb_{0.1}P_{0.5}F_{0.2}O_x$, $Pb_{0.2}Zn_{0.1\ B0.7}O_x$, and $Tl_{0.1}Pb_{0.2}B_{0.7}O_x$.

The oxide glass is obtained by mixing weighed quantities of oxides of the constituent elements and melting the mixture. The resulting glass is ground to the prescribed size by means of well-known mills and classifiers. Examples of the suitable mills include a vibration ball mill and a gyratory jet mill, and examples of the suitable classifiers include a vibration screen and a wind-force classifier.

The electrically insulating substance which can be used as a spacing layer additionally includes organic polymers. While any organic polymer that is inert to the components constituting the charge transporting layer can be used arbitrarily, preferred are polymethyl methacrylate, polyethylene, polystyrene, polypropylene, and polyvinylidene difluoride.

The spacing layer may be a discontinuous layer but is preferably a continuous porous film, still preferably a porous layer comprising particles of the above-described insulating materials. The insulating particles are preferably 5to 1000 times, still preferably 5 to 100 times, as large as the semiconductor particles in terms of diameter. The spacing layer preferably has a thickness of 0.05 to 10 μm (more preferably 0.05 to 5 μm).

In a photo cell using the photoelectric conversion device, the counter electrode functions as a positive electrode. The counter electrode usually may comprise a substrate having a conductor layer similarly to the conductive substrate of the work electrode (i.e., the photo electrode), but a substrate is not always required as far as sufficient strength or tight seal is secured. Examples of the conductive materials used in the counter electrode include metals (e.g., platinum, gold, silver, copper, aluminum, rhodium, and indium), carbon, and conductive metal oxides (e.g., indium-tin complex oxide and fluorine-doped tin oxide).

At least one of the conductive substrate of the work electrode (i.e., the photo electrode) and the counter electrode must be substantially transparent so that incident light can reach the photosensitive layer. It is preferred for the photoelectric conversion device of the invention that the conductive substrate be transparent and that light be incident upon this side. In this case, it is preferred that the counter electrode has light reflecting properties. The reflecting counter electrode includes a glass or plastic substrate having a metal layer or an electrically conductive oxide layer deposited thereon and a thin metal film.

In a highly preferred embodiment of the invention, the counter electrode has a porous electron-conducting layer.

The porous electron-conducting layer can be of any arbitrary material that is inert to the components constituting the charge transporting layer and allows electrons to move rapidly between the charge transporting layer and the counter electrode. Such a material preferably includes Au, Pt, carbon (e.g., graphite, carbon black, acetylene black, coke, carbon fiber, and graphitized carbon microbeads). The porous electron-conducting layer is preferably formed of electrically conductive particles bound together. The electrically conductive particles include particles of the above-described materials (especially platinum black) and, in addition, particles comprising substantially electrically insulating particles plated with Au or Pt, and particles of the above-described carbon material (especially graphite) having Pt partly supported thereon to have improved electron mobility. Blowing metal is also useful.

The porous electron-conducting layer preferably has a thickness of 0.1 to 100 μm, particularly 0.5 to 30 μm.

The porous spacing layer and the porous electron-conducting layer can be provided by coating the particulate semiconductor layer with dispersions of the insulating particles and conductive particles, respectively, in an appropriate dispersing medium. The particulate semiconductor layer, the spacing layer, and the electron-conducting layer can be provided either simultaneously or successively according to the heat resistance of the materials used. In a preferred embodiment, the semiconductor layer and the spacing layer are formed by simultaneous coating, followed by sintering, followed by dye adsorption, followed by coating with the dispersion of the conductive particles to form the electron-conducting layer. Alternatively, the electron-conducting layer may be formed on an counter electrode substrate (hereinafter described), which is superposed on the work electrode later.

Water and organic solvents are used as a dispersing medium. Organic solvents are preferred where the coating follows dye adsorption. Examples of suitable organic solvents are methanol, ethanol, methoxyacetonitrile, methoxypropionitrile, N-methylpyrrolidone and propylene carbonate. It is preferred to add to the dispersing medium an appropriate dispersing aid (e.g., carboxymethyl cellulose (CMC)) and an appropriate binder for improving the physical strength of the coating film. Polymers having a softening point of 60 to 300° C. are suitable binders. For example, polyvinylidene difluoride, a vinyl acetate-vinylmethyl methacrylate copolymer, and a vinylstyrene-vinyl acetate copolymer are preferred.

The substrate of the counter electrode having the porous electron-conducting layer may be either transparent or opaque. Any substrate that is capable of taking out the electrical current in contact with the electron-conducting layer can be used. For example, the substrate includes the same transparent conductive substrate as described for the work electrode, a glass or plastic substrate having metallic leads arranged thereon at regular intervals. With the metallic leads, the substrate itself does not need to be electrically conductive. Metallicplates substantially inert to the components of the charge transporting layer will also do. Such inert metallic plates include a platinumplate, stainless steel (SUS 316), and a platinum-plated aluminum or copper plate.

The charge transporting layer is a layer containing a charge transporting material having a function of replenishing oxidized dyes with electrons. The charge transporting material typically includes (1) ion transporting materials, such as a solution of ions of a redox system (i.e., an electrolytic solution) a gel electrolyte comprising a polymer matrix impregnated with a solution of a redox system, a molten salt electrolyte containing ions of a redox system, and a solid electrolyte, and (2) solid materials in which carriers move to take part in electric conduction, such as electron transporting materials and hole transporting materials.

The molten salt electrolyte is preferred for securing both photoelectric conversion efficiency and durability. Known iodine salts described, e.g., in WO 95/18456, JP-A-8-259543, and Denki Kagaku, vol. 65, No. 11, p. 923 (1997), such as pyridinium iodides, imidazolium iodides, and triazolium iodides, can be used.

Molten salts which can be used preferably include those represented by the following formulae (Y-a), (Y-b), and (Y-c):

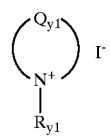

(Y-a)

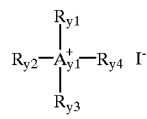

(Y-b)

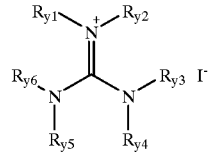

(Y-c)

In formula (Y-a), $Q_{y1}$ represents an atomic group forming a 5- or 6-membered aromatic cation together with the nitrogen atom. $Q_{y1}$ is preferably made up of at least one atom selected from the group consisting of carbon, hydrogen, nitrogen, oxygen, and sulfur. The 5-membered ring completed by $Q_{y1}$ is preferably an oxazole ring, a thiazole ring, an imidazole ring, a pyrazole ring, an isoxazole ring, a thiadiazole ring, an oxadiazole ring or a triazole ring, still preferably an oxazole ring, a thiazole ring or an imidazole ring, particularly preferably an oxazole ring or an imidazole ring. The 6-membered ring completed by $Q_{y1}$ is preferably a pyridine ring, a pyrimidine ring, a pyridazine ring, a pyrazine ring or a triazine ring, with a pyridine ring being still preferred.

In formula (Y-b), $A_{y1}$ represents a nitrogen atom or a phosphorus atom.

In formulae (Y-a), (Y-b) and (Y-c), $R_{y1}$, $R_{y2}$, $R_{y3}$, $R_{y4}$, $R_{y5}$, and $R_{y6}$ each independently represent a substituted or unsubstituted alkyl group (preferably a straight-chain, branched or cyclic alkyl group having 1 to 24 carbon atoms, such as methyl, ethyl, propyl, isopropyl, pentyl, hexyl, octyl, 2-ethylhexyl, t-octyl, decyl, dodecyl, tetradecyl, 2-hexyldecyl, octadecyl, cyclohexyl, or cyclopentyl) or a substituted or unsubstituted alkenyl group (preferably a straight-chain or branched alkenyl group having 2 to 24 carbon atoms, such as vinyl or allyl). $R_{y1}$, $R_{y2}$, $R_{y3}$, $R_{y4}$, $R_{y5}$, and $R_{y6}$ each preferably represent an alkyl group having 2 to 18 carbon atoms or an alkenyl group having 2 to 18 carbon atoms, particularly an alkyl group having 2 to 6 carbon atoms.

In formula (Y-b), two or more of $R_{y1}$, $R_{y2}$, $Ry_3$, and $R_{y4}$ may be linked together to form a non-aromatic ring containing $Ay_1$. In formula (Y-c), two or more of $R_{y1}$, $R_{y2}$, $R_{y3}$, $R_{y4}$, $Ry_5$, and $R_{y6}$ may be linked together to form a cyclic structure.

In formulae (Y-a), (Y-b), and (Y-c), $Qy_1$, $R_{y1}$, $Ry_2$, $R_{y3}$, $Ry_4$, $Ry_5$, and $R_{y6}$ may have a substituent. Examples of the suitable substituents include a halogen atom (e.g., F, Cl, Br or I), a cyano group, an alkoxy group (e.g., methoxy or ethoxy), an aryloxy group (e.g., phenoxy), an alkylthio group (e.g., methylthio or ethylthio), an alkoxycarbonyl group (ethoxycarbonyl), a carbonic ester group (e.g., ethoxycarbonyloxy), anacyl group (e.g., acetyl, propionyl or benzoyl), a sulfonyl group (e.g., methanesulfonyl or benzenesulfonyl), an acyloxy group (e.g., acetoxy or benzoyloxy), a sulfonyloxy group (e.g., methanesulfonyloxy or toluenesulfonyloxy), a phosphonyl group (e.g., diethylphosphonyl), an amido group (e.g., acetylamino or benzoylamino), a carbamoyl group (e.g., N,N-dimethylcarbamoyl), analkyl group (methyl, ethyl, propyl, isopropyl, cyclopropyl, butyl, 2-carboxyethyl or benzyl), an aryl group (e.g., phenyl or toluyl), a heterocyclic group (e.g., pyridyl, imidazolyl or furanyl), and an alkenyl group (e.g., vinyl or 1-propenyl).

The compounds represented by formulae (Y-a), (Y-b) or (Y-c) may form dimers or polymers at $Qy_1$, $R_{y1}$, $R_{y2}$, $R_{y3}$, $Ry_4$, $R_{y5}$ or $R_{y6}$.

These molten salts may be used either individually or as a mixture of two or more thereof or in combination with other molten salts of the above-described structures in which the iodide anion is replaced with other anions, preferably other halide ions (e.g., $Cl^-$ and $Br^-$), $NSC^-$, $BF_4^-$, $PF_6^-$, $ClO^{-4}$, $(CF_3SO_2)_2N^-$, $(CF_3CF_2SO_2)_2N^-$, $CF_3SO_3^-$, $CF_3COO^-$, $Ph_4B^-$, and $(CF_3SO_2)_3C^-$, particularly $(CF_3SO_2)_2N^-$ or $BF_4^-$. Other iodine salts, such as LiI, can also be added.

Specific examples of molten salts which are preferably used in the invention are shown below for illustrative purposes only but not for limitation.

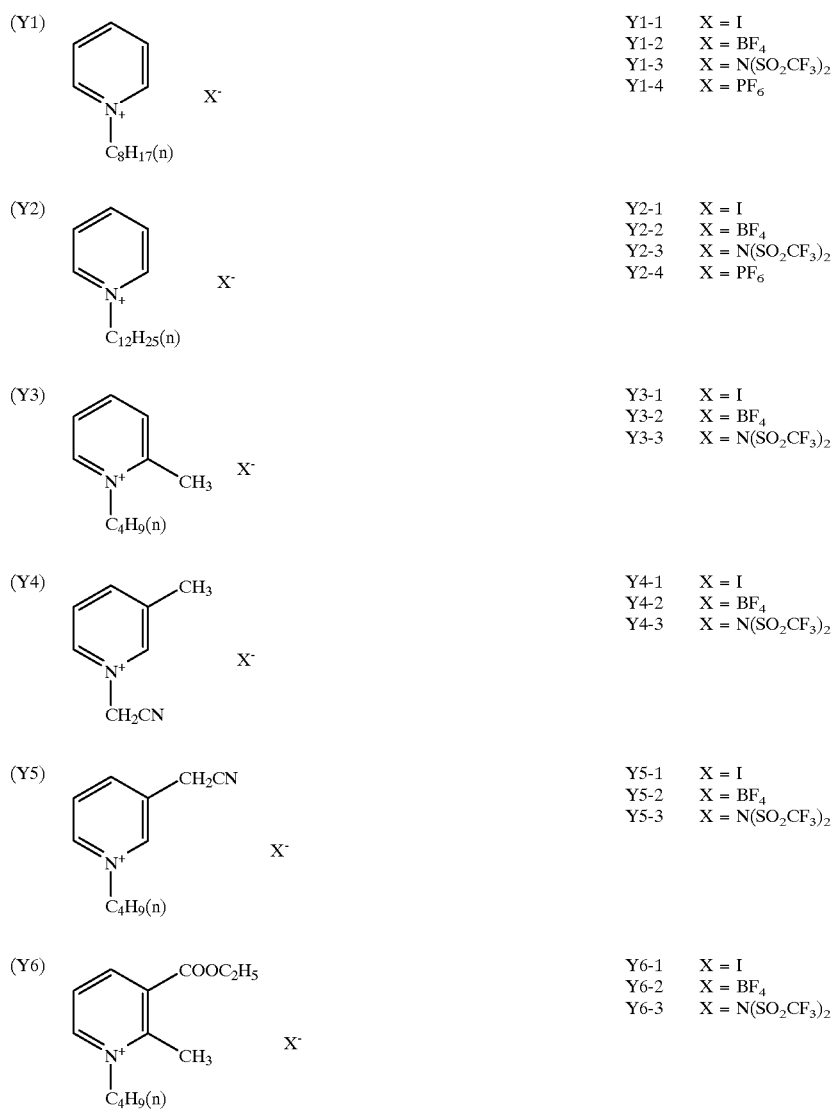

-continued

| | | | |
|---|---|---|---|
| (Y7) | [1-methyl-3-ethylimidazolium structure] X⁻ | Y7-1<br>Y7-2<br>Y7-3<br>Y7-4 | X = I<br>X = BF$_4$<br>X = N(SO$_2$CF$_3$)$_2$<br>X = Br |
| (Y8) | [1-methyl-3-n-butylimidazolium structure] X⁻ | Y8-1<br>Y8-2<br>Y8-3 | X = I<br>X = BF$_4$<br>X = N(SO$_2$CF$_3$)$_2$ |
| (Y9) | [1,2-dimethyl-3-n-hexylimidazolium structure] X⁻ | Y9-1<br>Y9-2<br>Y9-3 | X = I<br>X = BF$_4$<br>X = N(SO$_2$CF$_3$)$_2$ |
| (Y10) | [1-vinyl-3-n-butylimidazolium structure] X⁻ | Y10-1<br>Y10-2<br>Y10-3 | X = I<br>X = BF$_4$<br>X = N(SO$_2$CF$_3$)$_2$ |
| (Y11) | [oxazolium structure] X⁻ | Y11-1<br>Y11-2<br>Y11-3 | X = I<br>X = BF$_4$<br>X = N(SO$_2$CF$_3$)$_2$ |
| (Y12) | [thiadiazolium structure] X⁻ | Y12-1<br>Y12-2<br>Y12-3 | X = I<br>X = BF$_4$<br>X = N(SO$_2$CF$_3$)$_2$ |
| (Y13) | [bis-imidazolium structure] | Y13-1<br>Y13-2<br>Y13-3 | X = I<br>X = BF$_4$<br>X = N(SO$_2$CF$_3$)$_2$ |
| (Y14) | [benzimidazolium structure] X⁻ | Y14-1<br>Y14-2<br>Y14-3 | X = I<br>X = BF$_4$<br>X = N(SO$_2$CF$_3$)$_2$ |
| (Y15) | [fused bicyclic imidazolium structure] X⁻ | Y15-1<br>Y15-2<br>Y15-3 | X = I<br>X = BF$_4$<br>X = N(SO$_2$CF$_3$)$_2$ |
| (Y16) | [bis-pyridinium structure] X⁻ X⁻ | Y16-1<br>Y16-2<br>Y16-3 | X = I<br>X = BF$_4$<br>X = N(SO$_2$CF$_3$)$_2$ |
| (Y17) | [bis-pyridinium structure] X⁻ X⁻ | Y17-1<br>Y17-2<br>Y17-3 | X = I<br>X = BF$_4$<br>X = N(SO$_2$CF$_3$)$_2$ |

-continued

| | | |
|---|---|---|
| (Y18) (CH₃CH₂)₃N⁺(C₄H₉(n)) with CH₂CH₃ groups  X⁻ | Y18-1 | X = I |
| | Y18-2 | X = BF₄ |
| | Y18-3 | X = N(SO₂CF₃)₂ |
| | Y18-4 | X = PF₆ |
| (Y19) CH₃(CH₂CH₃)₂N⁺—(CH₂CH₂O)₂CH₃  X⁻ | Y19-1 | X = I |
| | Y19-2 | X = BF₄ |
| | Y19-3 | X = N(SO₂CF₃)₂ |
| (Y20) CH₃(OCH₂CH₂)₂—N⁺[(CH₂CH₂O)₂CH₃]₃  X⁻ | Y20-1 | X = I |
| | Y20-2 | X = BF₄ |
| | Y20-3 | X = N(SO₂CF₃)₂ |
| (Y21) ((i)C₃H₇)₂N⁺(CH₃)(CH₂CH₃)  X⁻ | Y21-1 | X = I |
| | Y21-2 | X = BF₄ |
| | Y21-3 | X = N(SO₂CF₃)₂ |
| (Y22) (CH₃CH₂)₃N⁺—CH₂CH₂O—C₆H₅  X⁻ | Y22-1 | X = I |
| | Y22-2 | X = BF₄ |
| | Y22-3 | X = N(SO₂CF₃)₂ |
| (Y23) N-methyl-N-butyl pyrrolidinium  X⁻ | Y23-1 | X = I |
| | Y23-2 | X = BF₄ |
| | Y23-3 | X = N(SO₂CF₃)₂ |
| (Y24) N-methyl-N-butyl morpholinium  X⁻ | Y24-1 | X = I |
| | Y24-2 | X = BF₄ |
| | Y24-3 | X = N(SO₂CF₃)₂ |
| (Y25) CH₃P⁺(C₄H₉(n))₃  X⁻ | Y25-1 | X = I |
| | Y25-2 | X = BF₄ |
| | Y25-3 | X = N(SO₂CF₃)₂ |
| (Y26) Aza-crown ether with CH₃CH₂(OCH₂CH₂)₂ and (CH₂CH₂O)₂CH₂CH₃  X⁻ | Y26-1 | X = I |
| | Y26-2 | X = BF₄ |
| | Y26-3 | X = N(SO₂CF₃)₂ |
| (Y27) Quinuclidinium with (CH₂CH₂O)₂OCH₂CH₃  X⁻ | Y27-1 | X = I |
| | Y27-2 | X = BF₄ |
| | Y27-3 | X = N(SO₂CF₃)₂ |

-continued (Y28)

| | |
|---|---|
| Y28-1 | X = I |
| Y28-2 | X = BF$_4$ |
| Y28-3 | X = N(SO$_2$CF$_3$)$_2$ |

(Y29)

| | |
|---|---|
| Y29-1 | X = I |
| Y29-2 | X = N(SO$_2$CF$_3$)$_2$ |
| Y29-3 | X = BF$_4$ |
| Y29-4 | X = PF$_6$ |

(Y30)

| | |
|---|---|
| Y30-1 | X = I |
| Y30-2 | X = N(SO$_2$CF$_3$)$_2$ |
| Y30-3 | X = BF$_4$ |
| Y30-4 | X = CF$_3$SO$_3$ |

(Y31)

| | |
|---|---|
| Y31-1 | X = I |
| Y31-2 | X = N(SO$_2$CF$_3$)$_2$X |
| Y31-3 | = BF$_4$ |

(Y32)

| | |
|---|---|
| Y32-1 | X = I |
| Y32-2 | X = N(SO$_2$CF$_3$)$_2$X |
| Y32-3 | = BF$_4$ |

(Y33)

| | |
|---|---|
| Y33-1 | X = I |
| Y33-2 | X = N(SO$_2$CF$_3$)$_2$X |
| Y33-3 | = BF$_4$ |

(Y34)

| | |
|---|---|
| Y34-1 | X = I |
| Y34-2 | X = N(SO$_2$CF$_3$)$_2$X |
| Y34-3 | = BF$_4$ |

(Y35)

| | |
|---|---|
| Y35-1 | X = I |
| Y35-2 | X = N(SO$_2$CF$_3$)$_2$X |
| Y35-3 | = BF$_4$ |

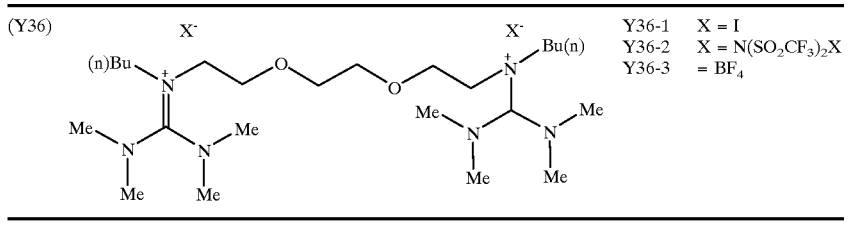

While the molten salt can be used with or without the solvent hereinafter described, it is preferred that the molten salt be present in an amount of at least 50% by weight based on the total electrolyte composition and that 50% by weight or more of the molten salt be the iodine salt.

It is preferable to add iodine to the electrolyte composition. Iodine is preferably added in an amount of 0.1 to 20% by weight, particularly 0.5 to 5% by weight, based on the total electrolyte composition.

Where an electrolytic solution is used in a charge transporting layer, it preferably comprises an electrolyte, a solvent, and additives. Preferred electrolytes include combinations of $I_2$ and iodides (for example, metal iodides, such as LiI, NaI, KI, CsI or $CaI_2$, and an iodine salt of quaternary ammonium compounds, such as a tetraalkylammonium iodide, pyridinium iodide and imidazolium iodide); combinations of $Br_2$ and bromides (for example, metal bromides, such as LiBr, NaBr, KBr, CsBr or $CaBr_2$, and a bromine salt of quaternary ammonium compounds, such as a tetraalkylammonium bromide or pyridinium bromide); metal complexes, such as a ferrocyananate-ferricyanate system or a ferrocene-ferricinium ion system; sulfur compounds, such as poly(sodium sulfide) and an alkylthiol-alkyl disulfide; viologen dyes; hydroquinone-quinone; and the like. Preferred of them are combinations of $I_2$ and an iodine salt of a quaternary ammonium compound, such as pyridinium iodide or imidazolium iodide. These electrolytes can be used either individually or as a mixture thereof.

A preferred electrolyte concentration is 0.1 to 15 M, particularly 0.2 to 10 M. Where iodine is added to the electrolyte, it is added preferably in a concentration of 0.01 to 0.5 M.

The solvent used in the electrolytic solution is preferably selected from those exhibiting excellent ion conductivity by having a low viscosity and a high dielectric constant. To have a low viscosity leads to an improvement in ion mobility. To have a high dielectric constant brings about an increase in effective carrier concentration. Examples of such solvents include carbonate compounds, such as ethylene carbonate and propylene carbonate; heterocyclic compounds, such as 3-methyl-2-oxazolidinone; ether compounds, such as dioxane and diethyl ether; acyclic ethers, such as ethylene glycol dialkyl ethers, propylene glycol dialkyl ethers, polyethylene glycol dialkyl ethers, and polypropylene glycol dialkyl ethers; alcohols, such as methanol, ethanol, ethylene glycol monoalkyl ethers, propylene glycol monoalkyl ethers, polyethylene glycol monoalkyl ethers, and polypropylene glycol monoalkyl ethers; polyhydric alcohols, such as ethylene glycol, propylene glycol, polyethylene glycol, polypropylene glycol, and glycerol; nitrile compounds, such as acetonitrile, glutaronitrile, methoxyacetonitrile, propionitrile, and benzonitrile; aprotic polar solvents, such as dimethyl sulfoxide (DMSO) and sulfolane; and water.

The electrolyte can contain a basic compound, such as t-butylpyridine, 2-picoline, and 2, 6-lutidine, as disclosed in J. Am. Ceram. Soc., vol. 80, No. 12, pp. 3157–3171 (1997). A preferred concentration of the basic compound is 0.05 to 2 M.

An electrode (i.e., liquid electrolyte) can be solidified to gel by addition of a polymer, addition of an oil gelling agent, polymerization of a polyfunctional monomer, crosslinking of a polymer, or a like technique. Polymers which can be added to cause the electrolyte to gel include the compounds described in J. R. MacCallum and C. A. Vincent, Elsevier Applied Science, "Polymer Electrolyte Reviews-1 and 2". Polyacrylonitrile and polyvinylidene fluoride are particularly preferred.

Oil gelling agents include the compounds disclosed in J. Chem. Soc. Japan, Ind. Chem. Sec., vol. 46, p. 779 (1943), J. Am. Chem. Soc., vol. 111, p. 5542 (1989), J. Chem. Soc., Chem. Commun., p. 390 (1993), Angew. Chem. Int. Ed. Engl., vol. 35, p. 1949 (1996), Chem. Lett., p. 885 (1996), and J. Chem. Soc., Chem. Commun., p. 545 (1997). Preferred of them are those having an amide structure in the molecule.

Where a gel electrolyte is prepared by polymerization of a polyfunctional monomer, a preferred process comprises applying a solution comprising a polyfunctional monomer, a polymerization initiator, an electrolyte, and a solvent to a dye-sensitized electrode by casting, coating, dipping, impregnation or a like technique to form a sol electrolyte layer, followed by radical polymerization to make the sol into gel. Preferred polyfunctional monomers are those having two or more ethylenically unsaturated groups per molecule, such as divinylbenzene, ethylene glycol dimethacrylate, ethylene glycol diacrylate, ethylene glycol dimethacrylate, diethylene glycol diacrylate, diethylene glycol dimethacrylate, triethylene glycol diacrylate, triethylene glycol dimethacrylate, pentaerythritol triacrylate, and trimethylolpropane triacrylate. The polyfunctional monomer can be used in combination with a monofunctional monomer. Preferred monofunctional monomers to be combined include esters or amides derived from acrylic acid or αalkylacrylic acids (e.g., methacrylic acid), such as N-isopropylacrylamide, acrylamide, 2-acrylamide-2-methylpropanesulfonic acid, acrylamidopropyltrimethylammonium chloride, methyl acrylate, hydroxyethyl acrylate, n-propyl acrylate, n-butyl acrylate, 2-methoxyethyl acrylate, and cyclohexyl acrylate; vinyl esters, such as vinyl acetate; esters derived from maleic acid or fumaric acid, such as dimethyl maleate, dibutylmaleate, anddiethyl fumarate; a sodiumsalt of maleic acid, fumaric acid or p-styrenesulfonic acid; acrylonitrile, methacrylonitrile; dienes, such as butadiene, cyclopentadiene and isoprene; aromatic vinyl compounds, such as styrene, p-chlorostyrene, and sodium styrenesulfonate; vinyl compounds having a nitrogen-containing heterocyclic ring, vinyl compounds having a quaternary ammonium salt, N-vinylformamide, N-vinyl-N-methylformamide vinylsulfonic acid, sodium vinylsulfonate, vinylidene fluoride, vinylidene chloride;

vinyl alkyl ethers, such as methyl vinyl ether; ethylene, propylene, 1-butene, isobutene, N-phenylmaleimide, and the like. The polyfunctional monomer is preferably used in a proportion of 0.5 to 70%, particularly 1.0 to 50%, by weight based on the total monomer mixture.

The monomers can be polymerized through radical polymerization generally followed for polymer synthesis in accordance with the processes described in Takayuki Ohtsu & Masaetsu Kinoshita, Kobunshi goseino jikkenho, Kagaku Dojin, and Takayuki Ohtsu, Koza jugohan-no ron I radical jugo (I), Kagaku Dojin. While the monomers for gel electrolytes which can be used in the invention are radical polymerizable by heat, light or electron beams or electrochemically, heat-induced radical polymerization is convenient.

Polymerization initiators which are preferably used in heat-induced radical polymerization include azo initiators, such as 2,2'-azobisisobutyronitrile, 2,2'-azobis(2,4-dimethylvaleronitrile), and dimethyl 2,2'-azobis(2-methylpropionate); and peroxide initiators, such as benzoyl peroxide. The polymerization initiator is preferably used in an amount of 0.01 to 20%, particularly 0.1 to 10%, by weight based on the total monomer mixture. The proportion of the monomers in the gel electrolyte is preferably 0.5 to 70%, particularly 1.0 to 50%, by weight.

Where an electrolyte is made into gel by crosslinking of a polymer, it is desirable to use a combination of a polymer having a crosslinkable group and a crosslinking agent. Preferred crosslinkable groups include a nitrogen-containing heterocyclic group, e.g., a pyridine ring, an imidazole ring, a thiazole ring, an oxazole ring, a triazole ring, a morpholine ring, a piperidine ring or a piperazine ring. Preferred crosslinking agents include reagents having di- or higher-functionality in electrophilic reaction with a nitrogen atom, such as alkyl halides, aralkyl halides, sulfonic esters, acid anhydrides, acid chlorides, and isocyanates.

In the present invention, an organic and/or an inorganic hole-transporting material can be used in place of the electrolyte. Examples of useful organic hole-transporting materials include aromatic amines, such as N,N'-diphenyl-N,N'-bis(4- methoxyphenyl) -(1,1'-biphenyl)-4,4'-diamine (see J. Hagenetal et al., *Synthetic Metal*, vol. 89, pp. 215–220 (1997)), 2,2', 7,7'- tetrakis(N,N-di-p-methoxyphenylamine) -9,9'-spirobifluorene (see *Nature*, vol. 395, pp. 583–585 (Oct. 8, 1998) and WO 097/10617), aromatic diamine compounds composed of tertiary aromatic amine units, 1,1-bis{4-(di-p-tolylamino) phenyl}cyclohexane, linked together (see JP-A-59-194393), aromatic amine compounds containing two or more tertiary amino groups and having two or more condensed aromatic rings each bonded to the nitrogen atom of the tertiary amino group, typically exemplified by 4,4'-bis [(N-1-naphthyl)-N-phenylamino]biphenyl (see JP-A-5-234681), aromatic tri-amines derived from triphenylbenzene and having a star-burst structure (see U.S. Pat. No. 4,923,774 and JP-A-4-308688), aromatic diamines, such as N,N'-diphenyl-N,N'-bis(3-methylphenyl)- (1,1'-biphenyl) -4,4'-diamine (see U.S. Pat. 4,764,625), α, α, α',α'-tetramethyl-α,α'-bis(4-di-p-tolylaminophenyl)-p- xylene (see JP-A-3-269084), p-phenylenediamine derivatives, triphenylamine derivatives which are sterically asymmetric as a whole molecule (see JP-A-4-129271), compounds having a plurality of aromatic diamino groups on a pyrenyl group (see JP-A-4-175395), aromatic diamines composed of aromatic tertiary amine units linked together via an ethylene group (see JP-A-4-264189), aromatic diamines having a styryl structure (see JP-A-4-290851), benzylphenyl compounds (see JP-A-4-364153), compounds composed of tertiary amines linked together via a fluorene group (see JP- A-5-25473), triamine compounds (see JP-A-5-239455), bisdipyridylaminobiphenyl compounds (see JP-A-5-320634), N,N,N-triphenylamine derivatives (see JP-A-6-1972), aromatic diamines having a phenoxazine structure (JP-A-7-138562), and diaminophenylphenanthridine derivatives (JP-A-7-252474); thiophene derivatives or oligomeric thiophene derivatives, such as α-octylthiophene, α, ω-dihexyl-α-octylthiophene (*see Adv. Mater.*, vol. 9, No. 7, p. 557 (1997)), hexadodecyldodecithiophene (see *Angew. Chem. Int. Ed. Engl.*, vol.34, No.3, pp.303–307 (1995)), and 2,8-dihexylanthra[2,3-b:6,7-b']dithiophene (see *JACS*, vol. 120, No. 4, pp. 664–672 (1998)); and electrically conductive polymers, such as polypyrrole compounds (see K. Murakoshi et al., *Chem. Lett.*, p. 471 (1997)) and polyacetylene and derivatives thereof, poly(p-phenylene) and derivatives thereof, poly(p- phenylenevinylene) and derivatives thereof, polythienylenevinylene and derivatives thereof, polythiophene and derivatives thereof, polyaniline and derivatives thereof, and polytoluidine and derivatives thereof (see Nalwa, *Handbook of Organic Conductive Molecules and Polymers*, vols. 1, 2, 3 and 4, Wiley ). As described in *Nature*, vol. 395, pp. 583–585 (Oct. 8, 1998), a compound containing a cationic radical, such as tris (4-bromophenyl) aluminum hexachloroantimonate, can be added to the organic hole-transporting material so as to control the dopant level, or a salt such as $Li[(CF_3SO_2)_2N]$ can be added to control the potential on the oxide semiconductor surface (i.e., compensation of a space charge layer).

The organic hole-transporting material can be introduced into the inside of the electrode by vacuum evaporation, casting, coating, spin coating, dipping, electrolytic polymerization, photoelectrolytic polymerization, and the like.

Where an inorganic solid compound is used, copper iodide (p-CuI) (see *J. Phys. D:Appl Phys.*, vol. 31, pp. 1492–1496 (1998)), copper thiocyanide (see *Thin Solid Films*, vol. 261, pp. 307–310 (1995), *J. Appl. Phys.*, vol. 80, No. 8, pp. 4749–4754 (Oct. 15, 1996), *Chem. Mater.*, vol. 10, pp. 1501–1509 (1998), and *Semicond. Sci. Technol.*, vol. 10, pp. 1689–1693), etc. is introduced into the inside of the electrode by means of casting, coating, spin coating, dipping, electrolytic plating, and the like.

Where the hole-transporting material is used in place of an electrolyte, it is preferred to provide a dense semiconductor layer, such as a thin titanium dioxide layer, as an undercoat layer for preventing a shortage by, for example, spray pyrolysis as described in *Electrochim. Acta*, vol. 40, pp. 643–652 (1995).

There are two conceivable methods of forming a charge transporting layer. One comprises adhering a counter electrode to the spacing layer or the porous electron-conducting layer provided on the spacing layer and penetrating a liquid charge transporting material into the gap therebetween. The other comprises forming a charge transporting layer on the spacing layer or the porous electron-conducting layer and then forming a counter electrode (substrate) thereon. The former method can be effected by an ordinary pressure process which makes use of capillarity by, for example, soaking or a vacuum process in which a gas phase is displaced with a liquid phase under reduced pressure.

The latter method includes various embodiments. Where the charge transporting layer is of a wet system, a counter electrode (substrate) is provided thereon while the layer is wet, and the edges call for a leakproof measure. In the case of a gel electrolyte, a wet electrolyte as applied may be solidified by, for example, polymerization. In this case, the counter electrode (substrate) may be provided after drying and solidification. A wet organic hole-transporting material or a gel electrolyte as well as an electrolytic solution can be applied in the same manner as for the formation of the particulate semiconductor layer or for dye adsorption, i.e., immersion, roll coating, dip coating, air knife coating, extrusion coating, slide hopper coating, wire bar coating, spin coating, spraying, casting, and various printing methods. A solid electrolyte or solid hole-transporting material can be applied by dry film forming techniques, such as vacuum evaporation or CVD.

The water content of the charge transporting layer is preferably 10,000 ppm or less, still preferably 2,000 ppm or less, particularly preferably 100 ppm or less.

If necessary, additional functional layers, such as a protective layer and an antireflection layer, can be formed on the conductive substrate of the work electrode (i.e., the photo electrode) and/or the counter electrode. Where a plurality of additional layers having the respective functions are to be provided, while they can be formed either simultaneously or successively, simultaneous coating is preferred for productivity. Simultaneous coating is conveniently carried out by a slide hopper method or extrusion coating method in view of productivity and uniformity of the film formed. Depending on the material, these functional layers may be provided by vapor deposition or press bonding method.

The photo cell of the invention preferably has its sides sealed with a polymer, an adhesive, etc. to prevent deterioration by oxidation or volatilization of the volatile matter contained therein.

The cell structure and the module structure of the photo cell, especially a dye-sensitized solar cell, to which the photoelectric conversion device of the invention is applied are then described. While a dye-sensitized solar cell basically has the same structure as the above-described photoelectric conversion device and photo cell, a variety of forms can be taken in conformity with the end use as shown in FIGS. 2 and 3. Conceivable forms are roughly divided into two types; structures which receive light from both sides (FIGS. 2A, 2D and 3G) and those which receive light from one side (FIGS. 2B, 2C, 3E, and 3F).

Figure 2A:
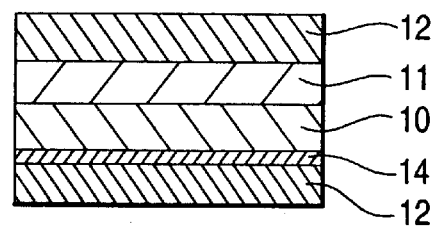
FIGS. 2A to 2D and FIGS. 3E to 3G each show cross sections of preferred photo cells according to the invention.
Figure 3E:
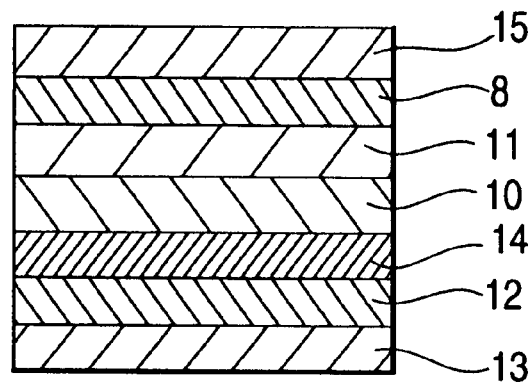
Figure 3F:
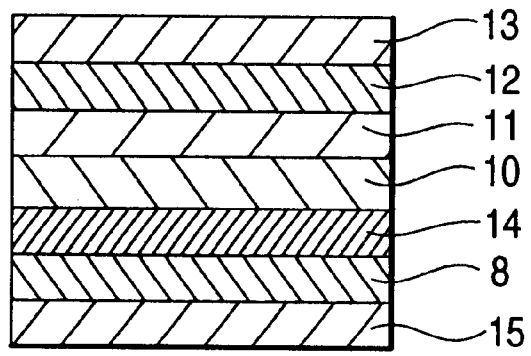
Figure 3G:
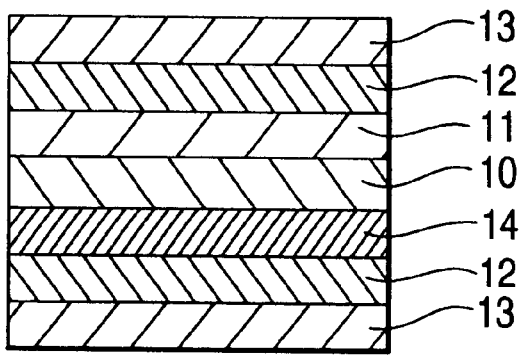

FIG. 2A is a structure made up of a pair of transparent conductor layers 12 having sandwiched therebetween a dye-sensitized semiconductor layer (i.e., a dye-adsorbed semiconductor layer) 14, a spacing layer (impregnating a charge transporting material) 10, and a porous electron-conducting layer (impregnating a charge transporting material) 11.

Figure 2B:
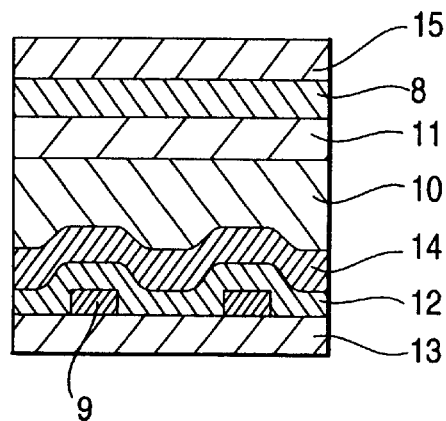

FIG. 2B is a structure having, in the order described, a transparent substrate 13, metal leads (or metal mesh) 9 (partially provided), a transparent conductor layer 12, a dye-sensitized semiconductor layer 14, a spacing layer 10, a porous electron- conducting layer. 11, a metal layer 8, and a supporting substrate 15.

Figure 2C:
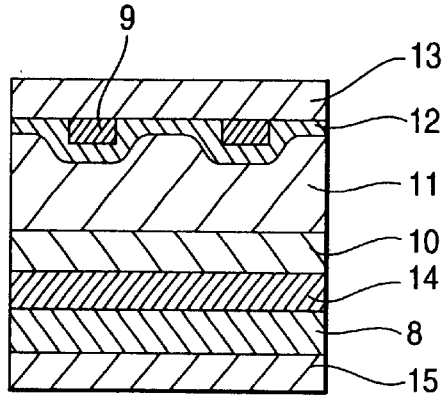

FIG. 2C shows a structure having, in the order described, a supporting substrate 15, a metal layer 8, a dye-sensitized semiconductor (i.e., dye-adsorbed) layer (impregnating a charge transporting material) 14, a spacing layer 10, a porous electron-conducting layer 11, a transparent conductor layer 12, and a transparent substrate 13 partially having thereon metal leads 9 with the metal lead side thereof inside.

Figure 2D:
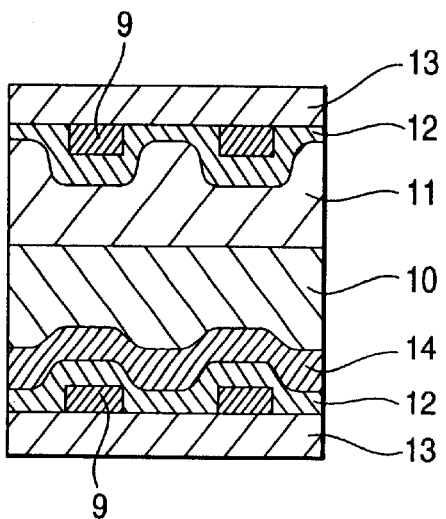

FIG. 2D is a structure made up of a pair of transparent substrates 13 each having metal leads 9 (partially provided) and a transparent conductor layer 12 with the transparent conductor layer 12 inside, having sandwiched therebetween a dye-sensitized semiconductor layer 14, a spacing layer 10, and a porous electron-conducting layer 11.

FIG. 3E shows a structure having, in the order described, a transparent substrate 13, a transparent conductor layer 12, a dye-sensitized semiconductor layer 14, a spacing layer 10, aporous electron-conducting layer 11, a metal layer 8, and a supporting substrate 15.

FIG. 3F shows a structure having, in the order described, a supporting substrate 15, a metal layer 8, a dye-sensitized semiconductor layer 14, a spacing layer 10, a porous electron- conducting layer 11, a transparent conductor layer 12, and a transparent substrate 13.

FIG. 3G. shows a structure composed of a pair of transparent substrates 13 each having on the inner side thereof a transparent conductor layer 12, having sandwiched therebetween a dye-sensitized semiconductor layer 14, a spacing layer 10, and a porous electron-conducting layer 11. In these structures, the void (e.g., pores) of the dye-sensitized (i.e., dye-adsorbed) semiconductor layers, spacing layers and porous electron-conducting layers are filled with a charge transporting material. If desired, a dense semiconductor undercoat layer may be provided between the dye-sensitized semiconductor layer 14 and the transparent conductor layer 12 or the metal layer 8.

The module of the dye-sensitized solar cell basically has the same structure as conventional solar cell modules. It generally comprises cells built up on a metallic, ceramic or like supporting substrate and covered with a filling resin or protective glass so that light can enter on the side opposite to the supporting substrate. Where the supporting substrate, on which the cells are provided, is made of a transparent material such as reinforced glass, the cells can take in light from the side of the transparent supporting substrate. The module structure includes a superstraight type, a substraight type or potting type or a substrate-integrated type used in amorphous silicon solar cells. A suitable module structure can be selected appropriately according to the end use or the place of use, i.e., the environment in which it is to be used.

A superstraight or substraight type module typically comprises a pair of supporting substrates one or both of which are transparent and have been subjected to an antireflection surface treatment, having cells interposed therebetween at regular intervals, the cells being connected to each other with a metal lead, flexible wiring, etc. A current collecting electrode is disposed at the outer edge to take out the generated power. In order to protect the cells and to increase the current collection efficiency, various plastic materials, such as ethylene-vinyl acetate (EVA), selected according to the purpose can be provided between the substrates and the cells in the form of a film or a filling. Where the module is for use in places free from shocks so that there is no need to cover the surface with a rigid material, the surface protective layer may be of a transparent plastic film, or the above-mentioned filling and/or a sealing material is hardened to serve as a protector which can take the place of the substrate on that side. To secure tight seal of the inside and rigidity of the module, the peripheries of the supporting substrates are fixed in a metal frame, and the gap between the substrates and the frame is sealed with a sealing material.

A solar cell could be constituted even on a curved surface by using flexible materials for the cells themselves, substrates, filling materials and sealing materials. Thus, solar cells having various forms or functions can be produced in conformity with the end use or the environment of Use.

On an industrial scale, solar cell modules of superstraight type are manufactured by, for example, successively providing a front substrate, fed from a substrate feeder and carried on a belt conveyor, etc., with cells together with a sealing matyerial, leads for cell connection, back side sealing material, and the like, putting a back substrate or a back cover, and setting a frame around the peripheries. Those of substraight type are manufactured by, for example, successively providing a supporting substrate, fed from a substrate feeder and carried on a belt conveyer, etc., with cells together with leads for cell connection, a sealing material, and the like, putting a front cover thereon, and setting a frame around the peripheries.

Modules of substrate-integrated type are produced by successively providing a supporting substrate with a transparent electrode layer, a photosensitive layer, a spacing layer, a porous electron-conducting layer, a charge transporting layer, a back electrode layer, etc. to build up three-dimensional structures at given intervals by known semiconductor processing techniques, such as selective plating, selective etching, CVD and PVD, or by mechanical processing techniques involving the step of forming a layer by coating in a pattern or a band form and patterning by laser machining, plasma CVM (see *Solar Energy Materials and Solar Cells*, vol. 48, pp. 373–381) or mechanical means, such as grinding.

The sealing material to be used in the module manufacture is selected from various materials, for example liquid EVA, a mixture of vinylidene fluoride copolymer and an acrylic resin, and an EVA film, in accordance with the purposes, such as improvement on weatherability, electrical insulation, improvement on light collection efficiency, protection of cells (improvement on impact resistance), and the like. The sealing material is applied on the cells by an appropriate method fit for the physical properties of the material. For example, a sealing material of film form is applied onto the cells bypressing with a roller or vacuum packaging, followed by heat sealing. A liquid or pasty sealing material can be applied by roll coating, bar coating, spraying, screen printing, or a like method. A transparent filler may be added to the sealing material to enhance the strength or to increase light transmission. Weatherable and moistureproof resins are convenient for sealing the gap between the periphery of the module and the frame.

Where a flexible substrate of PET, PEN, etc. is used, a highly productive production process is constituted by unrolling the substrate from a rollstock, building up cells thereon, and applying a sealing layer continuously in the manner described above.

In order to increase power generation efficiency of the module, the light-receiving side of the substrate (generally reinforced glass) is subjected to an antireflection surface treatment, such as laminating or coating with an antireflection coat. Further, incident light utilization efficiency can be increased by grooving or texturing the cell surface. It is important for obtaining increased power generation efficiency not only that light be took in the inside of the module with little loss but that the light having passed through the photosensitive layer and reached the opposite substrate be reflected and returned to the photosensitive layer. This is achieved by a method comprising mirror polishing the surface of the back substrate and applying Ag, Al, etc. by vapor deposition or plating, a method comprising providing the back side of the cell with an alloy layer of Al—Mg, Al—Ti, etc. as a reflecting layer, or a method comprising annealing to have the back side textured.

It is also important for increasing the power generation efficiency to minimize the resistance of intercellular connections thereby to suppress internal voltage drop. The cells are usually connected by wire bonding or with a conductive flexible sheet. In addition, a conductive adhesive tape or a conductive adhesive can be used for achieving both cells fixing and electrical connection among the cells, or a conductive hot-melt adhesive can be patternwise applied to desired sites.

Solar cells using a flexible substrate such as a polymer film are produced by successively forming cells on the substrate, being unrolled and transferred, in the manner described above, cutting to size, and sealing the periphery with a flexible and moistureproof material. A module structure called "SCAF"(see *Solar Energy Materials and Solar Cells*, vol. 48, pp. 383–391 (19 )) is also applicable. Solar cells having a flexible substrate can be used as adhered to curved glass.

EXAMPLE

The present invention will now be illustrated in greater detail with reference to Examples, but it should be understood that the invention is not limited thereto. Unless otherwise noted, all the percents are given by weight. Dyes and electrolytes used in Examples 1 and 3 and corresponding Comparative Examples are shown below.

Dye-1:

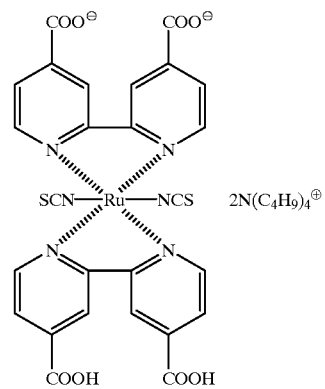

Dye-2:

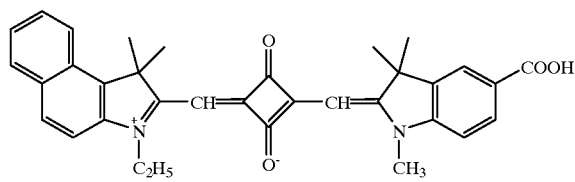

Dye-3:

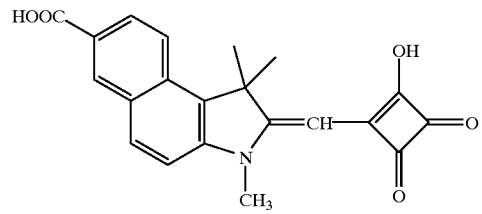

Dye-4:

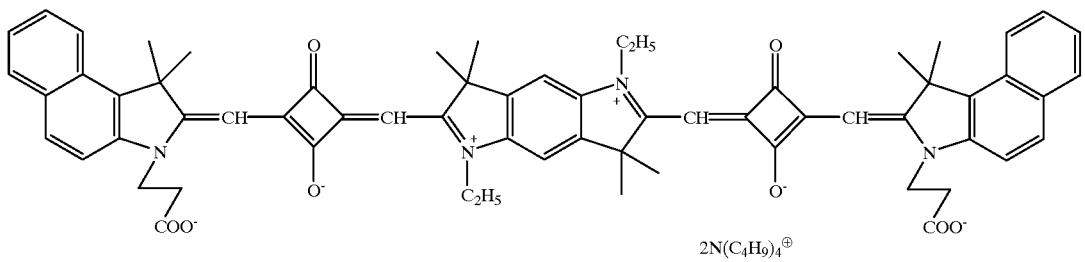

Electrolyte-1:

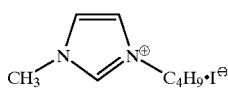

Electrolyte-2:

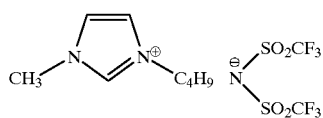

Example 1
1) Preparation of Titanium Dioxide-containing Coating Composition

A titanium dioxide dispersion having a concentration of 11% by weight was prepared in accordance with the method reported in C.J. Barbe, et al, *J. Am. Ceram. Soc.*, vol. 80, p. 3157 (1997), except that the auto clave temperature was set at 230° C. The average particle size of the dispersed titanium dioxide particles was about 10 nm. To the dispersion was added polyethylene glycol (molecular weight: 20,000, available from Wako Pure Chemical Ind., Ltd.) in an amount of 30% by weight based on the titanium dioxide to prepare a coating composition.

2) Preparation of Alumina-containing Coating Composition

A mixture of 18 g of alumina powder having an average particle size of 0.8 μm, 120 g of a 2% CMC aqueous solution, and 150 ml of water was stirred in a homogenizer at 1000 rpm for 3 minutes. To the resulting dispersion was added 1 ml of a 2% nonyl phenyl ether aqueous solution to prepare a coating composition.

3) Preparation of Dye-sensitized (i.e., dye-adsorbed) $TiO_2$ Electrode

The titanium dioxide dispersion prepared in (1) was applied to the conductive side of electrically conductive transparent glass having an F-doped tin oxide coat (available from Nippon Sheet Glass Co., Ltd.; surface resistivity: about 10 Ω/□) with a doctor blade to obtain a thickness of 100 μm. After drying, the alumina dispersion prepared in (2) was applied thereon to obtain a thickness of 25 μm. After drying at 5° C. for 30 minutes, the coated glass substrate was fired in an electric muffle furnace (Model FP-32, manufactured by Yamato Kagaku) at 450° C. for 30 minutes and cooled out of the furnace. The thicknesses of the titanium dioxide layer and the alumina layer were about 9 μm and about 2 μm, respectively.

The coated glass substrate was immersed in a solution of $3\times10^{-4}$ mol/l of dye-1 in 2-propanol for 18 hours. The dyed glass substrate was washed with ethanol and dried spontaneously in a dark place. The amount of the dye adsorbed was found to be about $1.35\times10^{-3}$ mol per $m^2$ of the $TiO_2$-coated area.

4) Preparation of Photo Cell

As shown in FIG. 1, the dye-sensitized $TiO_2$ (electrode) substrate (2 cm×2 cm) and a Pt-deposited glass substrate of the same size were brought into contact with the electrode layer 3 and the Pt deposit layer 6 facing each other. An electrolytic solution (an acetonitrile solution containing 0.65 mol/l of tetrabutylammonium iodide and 0.05 mol/l of iodine) was introduced into the gap between the two glass substrates by making use of capillarity so as to penetrate into the $TiO_2$ electrode. The edges of the cell were sealed with an epoxy sealing compound. The resulting photo cells (designated photo cells A, 5 samples) were each composed of, in sequence, a conductive glass substrate (glass substrate 1 with a transparent conductor layer (i.e., F-doped tin oxide coat) 2), a dye-sensitized (i.e., dye-adsorbed) $TiO_2$ (electrode) layer 3, a (porous aluminum) spacing layer 4, an electrolyte layer 5, a Pt layer 6, and glass 7.

For comparison, photo cells B (5 samples) were prepared in the same manner as for photo cells A, except that the alumina dispersion was not applied.

5) Measurement of Photoelectric Conversion Efficiency

The conductive glass and the Pt-deposited glass were connected by means of alligator clips, and the cell was irradiated with artificial sunlight having an intensity of 84 $mW/cm^2$ which was obtained by cutting light from a 500 W xenon lamp (produced by Ushio Inc.) through a spectral filter (AM1.5 Filter, produced by Oriel Corp.). The generated electricity was recorded with a Keithley electrometer (Model SMU238) to obtain an open circuit voltage ($V_{oc}$), a short circuit current density ($J_{sc}$), a fill factor (FF), and a conversion efficiency (η). The results obtained are also shown in Table 1.

TABLE 1

| Cell | Sample No. | $J_{SC}$ (mA/cm²) | $V_{OC}$ (V) | FF | η (%) |
|---|---|---|---|---|---|
| A (invention) | 1 | 13.1 | 0.71 | 0.73 | 5.7 |
| | 2 | 12.7 | 0.72 | 0.72 | 5.5 |
| | 3 | 12.8 | 0.71 | 0.73 | 5.6 |
| | 4 | 13.0 | 0.71 | 0.72 | 5.6 |
| | 5 | 13.2 | 0.70 | 0.72 | 5.6 |
| B (comparison) | 1 | 12.8 | 0.69 | 0.55 | 4.1 |
| | 2 | 13.0 | 0.70 | 0.48 | 3.7 |
| | 3 | 12.9 | 0.71 | 0.69 | 5.3 |
| | 4 | 13.0 | 0.71 | 0.60 | 4.6 |
| | 5 | 12.8 | 0.70 | 0.53 | 4.0 |

It is seen from the results in Table 1 that photo cells A having a spacing layer according to the invention secure a constant level of performance whereas the comparative cell structure (cells B) frequently undergoes reduction in fill factor. Measurement of the resistance of those cells B which had poor performance reveal that the shunt resistivity was low, indicating occurrence of an internal shortage.

Example 2

1) Preparation of Dye-sensitized (i.e., Dye-adsorbed) Electrode

A titanium dioxide layer and an alumina layer were formed on a 0.1 μm plate (10 cm×10 cm) having thereon a thin $TiO_2$ layer having a thickness of 1 μm provided by the sputtering method, in the same manner as in Example 1 while leaving edges in 1 cm width uncoated for sealing and taking out a lead, and the coated aluminum substrate was fired at 300° C. for 30 minutes to prepare an electrode having a 5 μm thick $TiO_2$ layer. Dyes were adsorbed on the $TiO_2$ electrode in the same manner as in Example 1, except for using a solution of $3\times10^{-4}$ M of dye-2, $3\times10^{-4}$ M of dye-3, $3\times10^{-4}$ M of dye-4, and $4\times10^{-2}$ M of cholic acid in a mixed solvent of DMSO and ethanol (2.5/97.5).

2) Preparation of Counter Electrode

Aluminum was sputtered on a 50 μm thick polyethylene naphthalate film (10 cm by 10 cm) to a deposit thickness of 2 μm in a line pattern (line width: 500 μm; interval: 5 mm). Platinum 6 was then sputtered on the entire surface to a deposit thickness of 10 nm. The resulting sheet had a surface resistivity of 0.2 Ω/□ and an average light transmission of 80%. An EVA-based heat sealant (i.e., a heat fusing material) was applied to the periphery of each sheet to a thickness of 10 μm.

3) Preparation of Photo Cell

The same electrolytic solution as used in Example 1 was infiltrated into the dye-sensitized $TiO_2$ electrode by means of a transfer roller. The counter electrode sheet prepared in 2) was superposed thereon with the platinum layer inside and press bonded through a pair of pressure rollers. The periphery was heat-sealed by means of a hot roller to obtain photo cells C (5 samples).

For comparison, photo cells D (5 samples) were prepared in the same manner, except that alumina spacing layer was not provided 4) Measurement of Photoelectric Conversion Efficiency The conversion efficiency of the resulting photo cells was measured under sunlight on a fine day with the same measuring instrument as used in Example 1. The results are shown in Table 2 immediately below.

TABLE 2

| Cell | Sample No. | $J_{SC}$ (mA/cm$^2$) | $V_{OC}$ (V) | FF | η (%) |
|---|---|---|---|---|---|
| C (invention) | 1 | 8.5 | 0.69 | 0.73 | 4.2 |
| | 2 | 7.9 | 0.70 | 0.72 | 3.9 |
| | 3 | 8.1 | 0.70 | 0.73 | 4.1 |
| | 4 | 8.3 | 0.71 | 0.72 | 4.2 |
| | 5 | 8.5 | 0.69 | 0.72 | 4.1 |
| D (comparison) | 1 | 7.5 | 0.69 | 0.45 | 2.3 |
| | 2 | 6.8 | 0.68 | 0.46 | 2.1 |
| | 3 | 7.2 | 0.66 | 0.38 | 1.8 |
| | 4 | 6.9 | 0.69 | 0.44 | 2.1 |
| | 5 | 7.1 | 0.68 | 0.61 | 2.9 |

As can be seen from Table 2, the comparative cells have extremely poor performance at a high frequency, while the present invention procedures of prescribed performance in a stable manner.

Example 3

A titanium oxide layer was formed on a conductive glass substrate in the same manner as in Example 1. A spacing layer was formed thereon in the same manner as in Example 1, except for replacing alumina with low-welting glass powder having a composition of Pb/B/P=0.2:0.4:0.4 (average particle size: about 0.5 μm), followed by firing to obtain an electrode having a $TiO_2$ layer of 2.5 μm in thickness. The dye was adsorbed on the $TiO_2$ electrode in the same manner as in Example 1. On the dye-sensitized $TiO_2$ electrode was spread 2 μl of a molten salt electrolyte (liquid at an ordinary temperature) consisting of 5 g of electrolyte-1, 5 g of electrolyte-2, and 0.3 g of iodine and allowed to stand under reduced pressure for 30 minutes to make the electrolyte completely infiltrate the electrode. The same counter electrode as used in Example 1 was superposed thereon and fixed in that state to obtain photo cells E (3 samples). Photo cells F (3 samples) were prepared by applying an external pressure of 1 kg/cm$^2$ on the cells prepared in the same manner until the dye-sensitized electrode and the counter electrode were brought into contact.

For comparison, cells G (3 samples) and cells H (3 samples) were prepared in the same manner as for cells E and cells F, respectively, except that the spacing layer was not provided.

The resulting cells were evaluated in the same manner as in Example 1, except that the cell was irradiated with artificial sunlight having intensity of 57 mW/cm . The results obtained are shown in Table 3 below.

TABLE 3

| Cell | Sample No. | $J_{SC}$ (mA/cm$^2$) | $V_{OC}$ (V) | FF | η (%) |
|---|---|---|---|---|---|
| E (invention) | 1 | 6.5 | 0.60 | 0.56 | 3.5 |
| | 2 | 6.6 | 0.62 | 0.55 | 3.6 |
| | 3 | 6.7 | 0.63 | 0.57 | 3.9 |
| F (invention) | 1 | 10.0 | 0.63 | 0.70 | 7.1 |
| | 2 | 9.5 | 0.62 | 0.71 | 6.7 |
| | 3 | 9.3 | 0.61 | 0.72 | 6.5 |
| G (comparison) | 1 | 6.4 | 0.60 | 0.50 | 3.1 |
| | 2 | 6.6 | 0.62 | 0.55 | 3.6 |
| | 3 | 6.6 | 0.61 | 0.54 | 3.5 |
| H (comparison) | 1 | 9.2 | 0.60 | 0.43 | 3.8 |
| | 2 | 9.3 | 0.60 | 0.50 | 4.5 |
| | 3 | 8.8 | 0.61 | 0.40 | 3.4 |

Comparative cells G have a small short circuit current. Comparative cells H having a reduced electrode-to-electrode distance achieve an increase of short circuit current but undergo a further reduction in fill factor and enjoy no improvement in conversion efficiency. To the contrary, cells F according to the spacing layer and a minimum electrode-to-electrode distance show an increase in both short circuit current and fill factor, leading to a considerable improvement of conversion efficiency. It has now been demonstrated that the effects of the present invention are fully exerted in the structure having the semiconductor electrode and the counter electrode are brought into contact with a spacing layer therebetween.

Example 4

1) Preparation of Titanium Dioxide-Containing Coating Composition

A titanium dioxide dispersion having a concentration of 11% by weight was prepared in accordance with the method reported in C. J. Barbe, et al, *J. Am. Ceram. Soc.*, vol. 80, p. 3157 (1997), except that titanium tetraisopropoxide was used as a raw material by and that the autoclave temperature was set at 230° C. The average particle size of the dispersed titanium dioxide particles was about 10 nm. To the dispersion was added polyethylene glycol (molecular weight:

20,000, available from Wako Pure Chemical Ind., Ltd.) in an amount of 30% by weight based on the titanium dioxide to prepare a coating composition.

2) Preparation of Alumina-Containing Coating Composition

A mixture of 18 g of alumina powder having an average particle size of 0.8 μm, 120 g of a 2% CMC aqueous solution, and 150 ml of water was stirred in a homogenizer at 1000 rpm for 3 minutes. To the resulting dispersion was added 1 ml of a 2% nonyl phenyl ether aqueous solution to prepare a coating composition.

3) Preparation of Pt-on-graphite Dispersion

In 100 ml of isopropyl alcohol was dissolved 10 mg of chloroauric acid, and 100 g of graphite powder (particle size: about 1 μm) was added thereto, followed by thoroughly stirring in a stirrer. The dispersion was heated at 60° C. for 30 minutes to prepare a dispersion of graphite particles having platinum supported thereon.

4) Preparation of Dye-sensitized (i.e., Dye-adsorbed) TiO2 Electrode

The conductive side of an electrically conductive transparent glass substrate having an F-doped tin oxide coat (available from Nippon Sheet Glass Co., Ltd.; surface resistivity: about 10 Ω/□) was coated with the titanium dioxide dispersion prepared in 1) with a doctor blade to obtain a thickness of 80 μm. After drying, the alumina dispersion prepared in 2) was applied thereon to a thickness of 25 μm. After air-drying for 30 minutes, the coated glass substrate was fired in an electric muffle furnace (Model FP-32, manufactured by Yamato Kagaku) at 450° C. for 30 minutes and cooled out of the furnace. The thicknesses of the titanium dioxide layer and the alumina layer were 7.2 μm and about 2 μm, respectively.

The coated glass substrate was immersed in a $3\times10^{-4}$ mol/l solution of dye R-1 in 2-propanol at room temperature for 16 hours. The dyed glass substrate was washed with acetonitrile and dried in a dark place.

5) Formation of Graphite Layer

The Pt-on-graphite dispersion prepared in 3) was applied onto the dye-sensitized TiO₂ electrode prepared in 4) by screen printing to give a coating thickness of about 30 μm, dried, and heated in a vacuum drier at 60° C. for 30 minutes to form a porous electron-conducting layer which would serve as a counter Infiltration of Electrolyte Five microliters of the electrolyte shown in Table 4 below was dropped on the graphite layer of the electrode laminate (2 cm×1.5 cm) prepared in 5), and the laminate was heated at 50° C. for 1 hour under reduced pressure to make the electrolyte infiltrate the pores of the laminate.

TABLE 4

| Electrolyte No. | Iodide | Other Salt | I₂ |
| --- | --- | --- | --- |
| 1 | (Y8-1) 0.7 g | (Y7-2) 0.3 g | 0.02 g |
| 2 | (Y8-1) 0.7 g | (Y7-2) 0.3 g | 0.002 g |
| 3 | (Y8-1) 0.5 g | (Y7-3) 0.3 g | 0.02 g |
| 4 | (Y4-1) 0.7 g | (Y4-2) 0.3 g | 0.02 g |
| 5 | (Y1-1) 0.5 g | (Y7-2) 0.5 g | 0.02 g |

7) Preperation of photo cell

An aluminum plate of the same size as the electrode laminate having sputtered thereon platinum was superposed on the electrode laminate with the platinum side inside in such a manner that the edges were uneven so that leads might be taken out. The edges of the two substrates were sealed with a heat-fusible adhesive.

The resulting photo cells were each composed of, in sequence, the conductive glass substrate, the dye-sensitized (i.e., dye-adsorbed) TiO₂ electrode layer (impregnated with the electrolyte), the alumina spacing layer (impregnated with the electrolyte), the graphite porous electron-conducting layer (impregnated with the electrolyte), the Pt layer, and the aluminum substrate. Other conceivable layer structures of the photo cells which can take advantage of the present invention are shown in FIGS. 2 and 3.

For comparison, a dye-sensitized TiO₂ electrode was prepared in the same manner as described in 4) above, except that the alumina spacing layer and the porous electron-conducting layer were not provided. Each of the electrolytes of Table 4 was infiltrated into the electrode layer in the same manner as in 6), and the same Pt-deposited aluminum substrate as used in 7) was superposed thereon with a polyethylene-made flame having a thickness of 20 μm being interposed therebetween as a spacer, and the edges were sealed by heating to prepare comparative photo cells.

8) Measurement of Photoelectric Conversion Efficiency

The two electrodes of each cell were connected with a lead, and the cell was kept at 30° C. in a thermostat holder and irradiated on its transparent electrode side with artificial sunlight having an intensity of 100 mW/cm² which was obtained by cutting light from a 500 W xenon lamp (produced by Ushio Inc.) through a spectral filter (AM1.5 Filter, produced by Oriel Corp.). The generated electricity was recorded with a Keithley electrometer (Model SMU238) to obtain an open circuit voltage ($V_{OC}$), a short circuit current density ($J_{SC}$) a fill factor (FF), and a conversion efficiency (η). The result obtained is also shown in Table 5.

TABLE 5

| Cell | Electrolyte No. | $J_{SC}$ (mA/cm²) | $V_{OC}$ (V) | FF | η (%) |
| --- | --- | --- | --- | --- | --- |
| Invention | 1 | 11.2 | 0.61 | 0.65 | 4.4 |
|  | 2 | 11.0 | 0.62 | 0.64 | 4.4 |
|  | 3 | 11.0 | 0.61 | 0.60 | 4.0 |
|  | 4 | 9.2 | 0.60 | 0.66 | 3.6 |
|  | 5 | 10.0 | 0.63 | 0.66 | 4.2 |
| Comparison | 1 | 6.8 | 0.58 | 0.65 | 2.6 |
|  | 2 | 7.2 | 0.55 | 0.63 | 2.5 |
|  | 3 | 6.9 | 0.58 | 0.58 | 2.3 |
|  | 4 | 4.3 | 0.57 | 0.66 | 1.6 |
|  | 5 | 5.5 | 0.58 | 0.67 | 2.1 |

The result in Table 5 prove that the photo cells according to the present invention have a high short circuit current, leading to a high conversation efficiency.

While the invention has been on has been described in detail and with reference to specefic examples thereof, it will be apparent to one skilled in the art that various changes and modifications can be made therein without departing from the spirit and scope thereof.

What is claimed is:

1. A photoelectric conversion device comprising at least a photosensitive semiconductor layer, a charge transporting layer, and a counter electrode, wherein an electrically insulating spacing layer is provided between said semiconductor layer and said counter electrode, said spacing layer having a thickness of 0.05 to 5 μm and comprising a material having an electrical conductivity of $1\times10^{-6}$ Siemens/cm or less.

2. The photoelectric conversion device as in claim 1, wherein said spacing layer is provided in contact with said photosensitive semiconductor layer.

3. The photoelectric conversion device as in claim 1, wherein said spacing layer is a porous layer comprising electrically insulating particles bound together.

4. The photoelectric conversion device as in claim 3, wherein said electrically insulating particles comprise an oxide of at least one element selected from aluminum, silicon, boron, and phosphorus.

5. The photoelectric conversion device as in claim 3, wherein said electrically insulating particles comprise an organic polymer.

6. The photoelectric conversion device as in claim 1, wherein said counter electrode has a porous electron-conducting layer.

7. The photoelectric conversion device as in claim 6, wherein said porous electron-conducting layer is in contact with said spacing layer.

8. The photoelectric conversion device as in claim 6, wherein said porous electron-conducting layer comprises electrically conductive particles bound together.

9. The photoelectric conversion device as in claim 8, wherein said electrically conductive particles are platinum black particles or carbon particles having platinum supported thereon.

10. The photoelectric conversion device as in claim 6, wherein said counter electrode comprises an electrically conductive substrate having provided thereon said porous electron-conducting layer.

11. The photoelectric conversion device as in claim 1, wherein said photosensitive semiconductor layer comprises titanium dioxide.

12. The photoelectric conversion device as in claim 1, wherein said photosensitive semiconductor layer is sensitized with a dye.

13. The photoelectric conversion device as in claim 1, wherein said charge transporting layer contains a molten salt.

14. A photo cell having a photoelectric device comprising at least a photosensitive semiconductor layer, a charge transporting layer, and a counter electrode, wherein an electrically insulating spacing is provided between said semiconductor layer and said counter electrode, said spacing layer having a thickness of 0.05 to 5 $\mu$m and comprising a material having an electrical conductivity of $1 \times 10^{-6}$ Siemens/cm or less.

15. The photo cell as in claim 14, wherein said counter electrode has a porous electron-conducting layer.

* * * * *